(12) United States Patent
Howald et al.

(10) Patent No.: US 10,403,482 B2
(45) Date of Patent: *Sep. 3, 2019

(54) SYSTEMS AND METHODS FOR TUNING AN IMPEDANCE MATCHING NETWORK IN A STEP-WISE FASHION FOR MULTIPLE STATES OF AN RF GENERATOR

(71) Applicant: Lam Research Corporation, Fremont, CA (US)

(72) Inventors: Arthur M. Howald, Livermore, CA (US); John C. Valcore, Jr., Fremont, CA (US); Andrew Fong, Pleasanton, CA (US); David Hopkins, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 123 days.

This patent is subject to a terminal disclaimer.

(21) Appl. No.: 15/635,065

(22) Filed: Jun. 27, 2017

(65) Prior Publication Data
US 2017/0294293 A1    Oct. 12, 2017

Related U.S. Application Data

(63) Continuation of application No. 15/098,189, filed on Apr. 13, 2016, now Pat. No. 9,711,332, which is a continuation-in-part of application No. 14/245,803, filed on Apr. 4, 2014, now Pat. No. 9,779,196.

(60) Provisional application No. 61/821,523, filed on May 9, 2013.

(51) Int. Cl.
*G06F 17/50*    (2006.01)
*H01J 37/32*    (2006.01)

(52) U.S. Cl.
CPC .... *H01J 37/32926* (2013.01); *G06F 17/5063* (2013.01); *H01J 37/32183* (2013.01)

(58) Field of Classification Search
None
See application file for complete search history.

(56) References Cited

U.S. PATENT DOCUMENTS 9,711,332 B2 * 7/2017 Howald ............ H01J 37/32183

* cited by examiner

*Primary Examiner* — Roy Y Yi
(74) *Attorney, Agent, or Firm* — Penilla IP, APC

(57) ABSTRACT

Systems and methods for tuning an impedance matching network in a step-wise fashion for each state are described. By tuning the impedance matching network in a step-wise fashion for each state instead of directly achieving optimum values of a radio frequency (RF) for each state and directly achieving an optimal value of a combined variable capacitance for each state, processing of a wafer using the tuned optimal values becomes feasible.

24 Claims, 12 Drawing Sheets

SYSTEMS AND METHODS FOR TUNING AN IMPEDANCE MATCHING NETWORK IN A STEP-WISE FASHION FOR MULTIPLE STATES OF AN RF GENERATOR

CLAIM OF PRIORITY

This application is a continuation of and claims the benefit, under 35 U.S.C. § 120, of co-pending U.S. patent application Ser. No. 15/098,189, filed on Apr. 13, 2016, and titled "SYSTEMS AND METHODS FOR TUNING AN IMPEDANCE MATCHING NETWORK IN A STEP-WISE FASHION FOR MULTIPLE STATES OF AN RF GENERATOR", which is a continuation-in-part of and claims the benefit, under 35 U.S.C. § 120, of U.S. patent application Ser. No. 14/245,803, filed on Apr. 4, 2014, and titled "SEGMENTING A MODEL WITHIN A PLASMA SYSTEM", which claims the benefit or and priority, under 35 U.S.C. § 119(e), to provisional patent application No. 61/821,523, filed on May 9, 2013, and titled "SEGMENTING A MODEL WITHIN A PLASMA SYSTEM", all of which are incorporated by reference herein in their entirety.

FIELD

The present embodiments relate to systems and methods for tuning an impedance matching network in a step-wise fashion for multiple states of a radio frequency (RF) generator.

BACKGROUND

Plasma systems are used to control plasma processes. A plasma system includes multiple radio frequency (RF) sources, an impedance match, and a plasma reactor. A workpiece is placed inside the plasma chamber and plasma is generated within the plasma chamber to process the workpiece. It is important that the workpiece be processed in a similar or uniform manner. To process the workpiece in a similar or uniform manner, it is important that the RF sources and the impedance match be tuned.

It is in this context that embodiments described in the present disclosure arise.

SUMMARY

Embodiments of the disclosure provide apparatus, methods and computer programs for tuning an impedance matching network in a step-wise fashion for multiple states of a radio frequency (RF) generator. It should be appreciated that the present embodiments can be implemented in numerous ways, e.g., a process, an apparatus, a system, a piece of hardware, or a method on a computer-readable medium. Several embodiments are described below.

In a pulsing plasma system, e.g., a plasma system in which plasma that is generated or maintained by a pulsed RF signal that is generated by the RF generator, etc., a pulsing plasma has one set of RF powers in one state, e.g., S1, etc., and a second set of RF powers in a second state, e.g., S2, etc. Because the RF pulsing times are short, e.g., pulsing repetition rate is typically 100 hertz (Hz) to 10 kilohertz (kHz), etc., a motor driven variable capacitor of an impedance matching network cannot respond to the pulses of the RF signal and the variable capacitor is set to a compromise value that is the same for both the states.

Some advantages of the herein described systems and methods include applying the step-wise fashion in which to tune a variable capacitance of the impedance matching network. In the step-wise fashion, during the state S1, an optimum value of an RF frequency of an RF signal generated by the RF generator for the state S1 and an optimum value of a combined variable capacitance of an impedance matching network for which a combination of voltage reflection coefficients for the states S1 and S2 at an input of a model system is minimum is calculated. Moreover, a local value of the RF frequency is determined for which the voltage reflection coefficient for the state S1 is a minimum. Furthermore, during the state S2, an optimum value of an RF frequency of the RF signal generated by the RF generator for the state S2 is calculated. Moreover, a local value of the RF frequency is determined for which the voltage reflection coefficient for the state S2 is a minimum. Instead of applying the optimum value of the combined variable capacitance, a step value of the combined variable capacitance is applied to the impedance matching network. The step-wise fashion is then repeated using the step value, the local value of the RF frequency for the state S1, and the local value of the RF frequency for the state S2 to apply another step value of the combined variable capacitance. The step value is incremented until an optimum value of the combined variable capacitance is reached. It is difficult to achieve an optimum value of the combined variable capacitance directly from a value at which the impedance matching network is operating at the same time an optimal value of the RF frequency is achieved. This is because it is difficult to control one or more variable capacitors of the impedance matching network with the same speed as that of controlling the RF generator. By using the step-wise fashion, optimal values of the variable capacitance and of the RF frequency are achieved.

Further advantages include tuning to a compromise optimum value that has other than zero reflected power. For example, when plasma is pulsed between multiple states, a radio frequency of the RF signal that is generated by the RF generator changes quickly to have different values in the pulsing states, but a variable capacitor of an impedance matching circuit cannot. There are three variable parameters, e.g., an RF frequency of the RF signal in the state S1, an RF frequency of the RF signal in the state S2, and a position of a variable capacitor of the impedance matching network, etc., to tune four quantities, e.g., the real and imaginary parts of reflection coefficients in the states S1 and S2, etc. It is difficult to simultaneously achieve zero reflected power for both the pulsing states S1 and S2 so the compromise optimum value of a reflection coefficient is achieved for both the states S1 and S2. To obtain an optimum compromise, e.g., minimizing a quantity $A*\Gamma(S1)+(1-A)*\Gamma(S2)$, where $\Gamma(S1)$ and $\Gamma(S2)$ are voltage reflection coefficients for the pulsing states S1 and S2, and A is a coefficient between 0 and 1, etc., a model system is used to find the position of the variable capacitor, and the two RF frequencies for the optimum compromise.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

DETAILED DESCRIPTION

The following embodiments describe systems and methods for tuning an impedance matching network in a stepwise fashion for multiple states of a radio frequency (RF) generator. It will be apparent that the present embodiments may be practiced without some or all of these specific details. In other instances, well known process operations have not been described in detail in order not to unnecessarily obscure the present embodiments.

Figure 1:
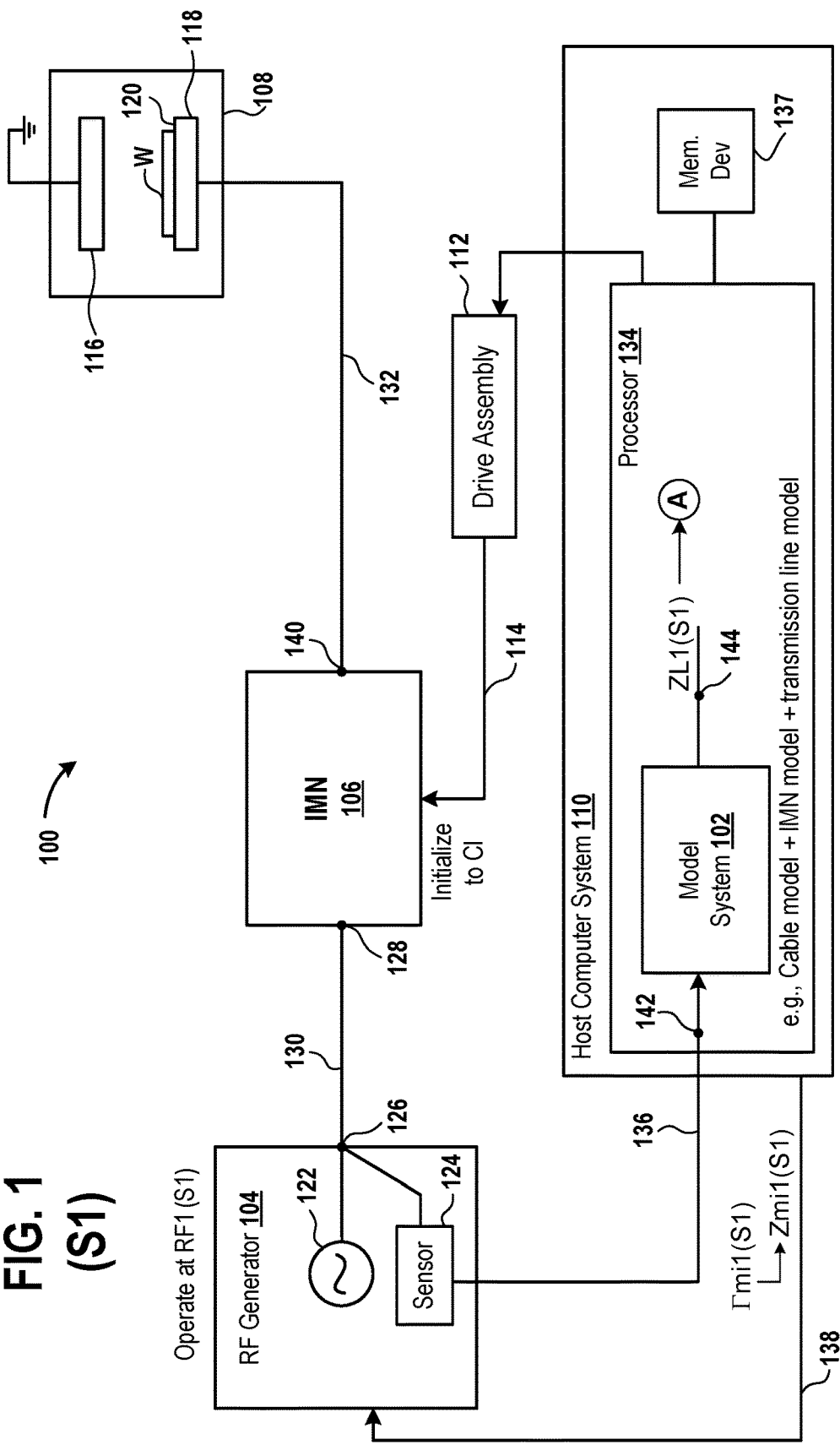
FIG. 1 is a diagram of an embodiment of a plasma system to illustrate generation of a load impedance ZL1(S1) using a model system for a state S1.

FIG. 1 is a diagram of an embodiment of a plasma system 100 to illustrate generation of a load impedance ZL1(S1) using a model system 102 for a state S1. The plasma system 100 includes a radio frequency (RF) generator 104, an impedance matching network 106, and a plasma chamber 108. The plasma system 100 includes a host computer system 110, a drive assembly 112, and one or more connection mechanisms 114.

The plasma chamber 108 includes an upper electrode 116, a chuck 118, and a wafer W. The upper electrode 116 faces the chuck 118 and is grounded, e.g., coupled to a reference voltage, coupled to zero voltage, coupled to a negative voltage, etc. Examples of the chuck 118 include an electrostatic chuck (ESC) and a magnetic chuck. A lower electrode of the chuck 118 is made of a metal, e.g., anodized aluminum, alloy of aluminum, etc. In various embodiments, the lower electrode of the chuck 118 is a thin layer of metal that is covered by a layer of ceramic. Also, the upper electrode 116 is made of a metal, e.g., aluminum, alloy of aluminum, etc. In some embodiments, the upper electrode 116 is made from silicon. The upper electrode 116 is located opposite to and facing the lower electrode of the chuck 118. The wafer W is placed on a top surface 120 of the chuck 118 for processing, e.g., depositing materials on the wafer W, or cleaning the wafer W, or etching layers deposited on the wafer W, or doping the wafer W, or implantation of ions on the wafer W, or creating a photolithographic pattern on the wafer W, or etching the wafer W, or sputtering the wafer W, or a combination thereof.

In some embodiments, the plasma chamber 108 is formed using additional parts, e.g., an upper electrode extension that surrounds the upper electrode 116, a lower electrode extension that surrounds the lower electrode of the chuck 118, a dielectric ring between the upper electrode 116 and the upper electrode extension, a dielectric ring between the lower electrode and the lower electrode extension, confinement rings located at edges of the upper electrode 116 and the chuck 118 to surround a region within the plasma chamber 108 in which plasma is formed, etc.

The impedance matching network 106 includes one or more circuit components, e.g., one or more inductors, or one or more capacitors, or one or more resistors, or a combination or two or more thereof, etc., which are coupled with each other. For example, the impedance matching network 106 includes a series circuit that includes an inductor coupled in series with a capacitor. The impedance matching network 106 further includes a shunt circuit connected to the series circuit. The shunt circuit includes a capacitor connected in series with an inductor. The impedance matching network 106 includes one or more capacitors and corresponding capacitances of the one or more capacitors, e.g., all variable capacitors, etc., are variable, e.g., are varied using a drive assembly, etc. The impedance matching network 106 includes one or more capacitors that have fixed capacitances, e.g., which cannot be changed using the drive assembly 112, etc. A combined variable capacitance of the one or more variable capacitors of the impedance matching network 1 is a value C1. For example, corresponding oppositely-located plates of the one or more variable capacitors are adjusted to be at a fixed position to set the variable capacitance C1. An example of an impedance matching network 106 is provided in the patent application having application Ser. No. 14/245,803.

In some embodiments, the model system 102 includes a computer-generated model of the impedance matching network 106. For example, the model system 102 is generated by a processor 134 of the host computer system 110. The match network model is derived from e.g., represents, etc., a branch of the impedance matching network 106. For example, when an x megahertz (MHz) RF generator is connected to the branch circuit of the impedance matching network 106, the match network model represents, e.g., is a computer-generated model of, etc., the circuit of the branch circuit of the impedance matching network 106. As another example, the match network model does not have the same number of circuit components as that of the impedance matching network 106.

In some embodiments, the match network model has a lower number of circuit elements than a number of circuit components of the impedance matching network 106. To illustrate, the match network model is a simplified form of the branch circuit of the impedance matching network 106. To further illustrate, variable capacitances of multiple variable capacitors of the branch circuit of the impedance matching network 106 are combined into a combined variable capacitance represented by one or more variable capacitive elements of the match network model, fixed capacitances of multiple fixed capacitors of the branch circuit of the impedance matching network 106 are combined into a combined fixed capacitance represented by one or more fixed capacitive elements of the match network model, and/or inductances of multiple fixed inductors of the branch circuit of the impedance matching network 106 are combined into a combined inductance represented by one or more inductive elements of the match network model, and/or resistances of multiple resistors of the branch circuit of the impedance matching network 106 are combined into a fixed resistance represented by one or more of resistive elements of the match network model. To illustrate more, capacitances of capacitors that are in series are combined by inverting each of the capacitances to generate multiple inverted capacitances, summing the inverted capacitances to generate an inverted combined capacitance, and by inverting the inverted combined capacitance to generate a combined capacitance. As another illustration, multiple inductances of inductors that are connected in series are summed to generate a combined inductance and multiple resistances of resistors that are in series are combined to generate a combined resistance. All fixed capacitances of all fixed capacitors of the branch circuit of the impedance matching network 106 are combined into a combined fixed capacitance of one or more fixed capacitive elements of the match network model. Other examples of the match network model are provided in the patent application having application Ser. No. 14/245,803. Also, a manner of generating a match network model from an impedance matching network is described in the patent application having application Ser. No. 14/245,803.

In various embodiments, each matching network model, e.g., one each for the x MHz RF generator, the y MHz RF generator, and the z MHz RF generator, is generated to operate in a narrow band of frequencies. As an example, the 60 MHz RF generator operates in the narrow band, e.g., between 57 and 63 MHz, etc. While in some embodiments, many circuit elements are used to accurately model the branch circuit of the impedance matching network 106 that operates within a pre-determined range, e.g., from direct current (DC) power to 200 MHz, in several embodiments, a simplified version that models an operation of the branch circuit in a narrower range, e.g., within a pre-determined percentage range from a frequency centered on 60 MHz, etc., is used. An example of the pre-determined percentage range is +/−5% from 60 MHz. Another example of the pre-determined percentage range is +/−4% from 60 MHz. The simplified version has a lesser number of circuit elements that a number of circuit components of the impedance matching network.

In some embodiments, the match network model is generated from a schematic for the impedance matching network 106 that has three branches, one each for x MHz, y MHz, and z MHz RF generators, which are further described below. The three branches join each other at an output 140 of the impedance matching network 106. The schematic initially includes a number of inductors and capacitors in various combinations. For one of the three branches considered individually, the match network model represents one of the three branches. Circuit elements are added to the match network model via an input device, examples of which are provided below. Examples of circuit elements added include resistors, not previously included in the schematic, to account for power losses in the branch of the impedance matching network 106, inductors, not previously included in the schematic, to represent an inductance of various connecting RF straps, and capacitors, not previously included in the schematic, to represent parasitic capacitances. Moreover, some circuit elements are further added to the schematic via the input device to represent a transmission line nature of the branch of the impedance matching network 106 because of physical dimensions of the impedance matching network 106. For example, an uncoiled length of one or more inductors in the branch of the impedance matching network 106 is not negligible compared to a wavelength of an RF signal passing via the one or more inductors. To account for this effect, an inductor in the schematic is divided into 2 or more inductors. Thereafter, some circuit elements are removed via the input device from the schematic to generate the match network model.

In various embodiments, the match network model has the same topology, e.g., connections between circuit elements, number of circuit elements, etc., as that of the branch circuit of the impedance matching network 106. For example, if the branch circuit of the impedance matching network 106 includes a capacitor coupled in series with an inductor, the match network model includes a capacitor coupled in series with an inductor. In this example, the inductors of the branch circuit of the impedance matching network 106 and of the match network model have the same value and the capacitors of the branch circuit of the impedance matching network 106 and of the match network model have the same value. As another example, if the branch circuit of the impedance matching network 106 includes a capacitor coupled in parallel with an inductor, the match network model includes a capacitor coupled in parallel with an inductor. In this example, the inductors of the branch circuit of the impedance matching network 106 and of the match network model have the same value and the capacitors of the branch circuit of the impedance matching network 106 and of the model system 102 have the same value. As another example, the match network model has the same number and same types of circuit elements as that of circuit components of the impedance matching network 1 and has the same type of connections between the circuit elements as that between the circuit components. Examples of types of circuit elements include resistors, inductors, and capacitors. Examples of type of connections include serial, parallel, etc.

In various embodiments, the model system 102 includes a combination of the match network model and an RF transmission model. An input of the match network model is the input 142. The RF transmission model is connected in series to an output of the match network model and has the output 144. The RF transmission model is derived from the RF transmission line 132 in a similar manner in which the match network model is derived from the impedance matching network 106. For example, the RF transmission model has inductances, capacitances, and/or resistances that are derived from inductances, capacitances, and/or resistances of the RF transmission line 132. As another example, a capacitance of the RF transmission model matches a capacitance of the RF transmission line 132, an inductance of the RF transmission model matches an inductance of the RF transmission line 132, and a resistance of RF transmission model matches a resistance of the RF transmission line 132.

In some embodiments, the model system 102 includes a combination of an RF cable model, the match network model, and an RF transmission model. An input of the RF cable model is the input 142. An output of the RF cable model is connected to an input of the match network model and an output of the match network model is connected to an input of the RF transmission model. The RF transmission model has the output 144. The RF cable model is derived from the RF cable 130 in a similar manner in which the match network model is derived from the impedance matching network 106. For example, the RF cable model has inductances, capacitances, and/or resistances that are derived from inductances, capacitances, and/or resistances of the RF cable 130. As another example, a capacitance of the RF cable model matches a capacitance of the RF cable 130, an inductance of the RF cable model matches an inductance of the RF cable 130, and a resistance of RF cable model matches a resistance of the RF cable 130.

Moreover, the RF generator 104 includes an RF power supply 122 for generating the RF signal. The RF generator 104 includes a sensor 124, e.g., a complex impedance sensor, a complex current and voltage sensor, a complex reflection coefficient sensor, a complex voltage sensor, a complex current sensor, etc., that is connected to an output 126 of the RF generator 104. The output 126 is connected to an input 128 of the branch circuit of the impedance matching network 106 via an RF cable 130. The impedance matching network 106 is connected to the plasma chamber 108 via an RF transmission line 132, which includes an RF rod and an RF outer conductor that surrounds the RF rod.

The drive assembly 112 includes a driver, e.g., one or more transistors, etc., and a motor, and the motor is connected via the connection mechanism 114 to a variable capacitor of the impedance matching network 106. Examples of the connection mechanism 114 include one or more rods, or rods that are connected to each other via a gear, etc. The connection mechanism 114 is connected to a variable capacitor of the impedance matching network 106. For example, the connection mechanism 114 is connected to a variable capacitor that is a part of the branch circuit that is connected to the RF generator 104 via the input 128.

It should be noted that in case the impedance matching network 106 includes more than one variable capacitor in the branch circuit that is connected to the RF generator 104, the drive assembly 112 includes separate motors for controlling the more than one variable capacitor, and each of the motors is connected via a corresponding connection mechanism to the corresponding variable capacitor. In this case, the multiple connection mechanisms are referred to as the connection mechanism 114.

The RF generator 106 is the x megahertz (MHz) RF generator or the y MHz RF generator or the z MHz RF generator. In some embodiments, an example of the x MHz RF generator includes a 2 MHz RF generator, an example of the y MHz RF generator includes a 27 MHz RF generator, and an example of the z MHz RF generator includes a 60 MHz RF generator. In various embodiments, an example of the x MHz RF generator includes a 400 kHz RF generator, an example of the y MHz RF generator includes a 27 MHz RF generator, and an example of the z MHz RF generator includes a 60 MHz RF generator.

It should be noted that in case two RF generators, e.g., the x and y MHz RF generators, etc., are used in the plasma chamber 100, one of the two RF generators is connected to the input 128 and another one of the RF generators is connected to another input of the impedance matching network 106. Similarly, in case three RF generators, e.g., the x, y, and z MHz RF generators, etc., are used in the plasma chamber 100, one of the two RF generators is connected to the input 128, a second one of the RF generators is connected to a second input of the impedance matching network 106, and a third one of the RF generators is connected to a third input of the impedance matching network 106. The output 140 is connected to the input 128 via the branch circuit of the impedance matching network 106. In the embodiments in which multiple RF generators are used, the output 140 is connected to the second input via a second branch circuit of the impedance matching network 106 and the output 140 is connected to the third input via a third branch circuit of the impedance matching network 106.

The host computer system 110 includes the processor 134 and a memory device 137. The memory device 137 stores the model system 102. The model system 102 is accessed from the memory device 137 for execution by the processor 134. Examples of the host computer 110 include a laptop computer or a desktop computer or a tablet or a smart phone, etc. As used herein, instead of the processor, a central processing unit (CPU), a controller, an application specific integrated circuit (ASIC), or a programmable logic device (PLD) is used, and these terms are used interchangeably herein. Examples of a memory device include a read-only memory (ROM), a random access memory (RAM), a hard disk, a volatile memory, a non-volatile memory, a redundant array of storage disks, a Flash memory, etc. The sensor 124 is connected to the host computer system 110 via a network cable 136. Examples of a network cable, as used herein, is a cable used to transfer data in a serial manner, or in a parallel manner, or using a Universal Serial Bus (USB) protocol, etc.

During the state S1, the RF generator 104 is operated at a radio frequency RF1(S1). For example, the processor 134 provides a recipe that includes the radio frequency level RF1(S1) and a power level for the state S1 to the RF generator 104. The RF generator 104 operates between two states S1 and S2. During the state S1, the RF signal has a power level, e.g., one or more power amounts, a root mean square power amount of the one or more power amounts, a power level of an envelope of an RF signal, etc., that is greater than a power level of the RF signal during the state S2. Similarly, during the state S1, the RF signal has a frequency level, e.g., one or more frequency amounts, a root mean square frequency amount of the one or more frequency amounts, a frequency level of an envelope of the RF signal, etc., that is greater than a frequency level of the RF signal during the state S2. The state S1 is referred to herein as a high state and the state S2 is referred to herein as a low state.

In some embodiments, during the state S2, the RF signal has a power level that is greater than a power level of the RF signal during the state S1. Similarly, in these embodiments, during the state S2, the RF signal has a frequency level, e.g., one or more frequency amounts, a root mean square frequency amount of the one or more frequency amounts, etc., that is greater than or less than a frequency level of the RF signal during the state S1. In these embodiments, the state S1 is referred to herein as a low state and the state S2 is referred to herein as a high state.

In various embodiments, during the state S2, the RF signal has a power level that is equal to a power level of the RF signal during the state S1.

In some embodiments in which multiple RF generators are used, the state S1 of an RF signal generated by a first one of the RF generators has a power level higher than the state S2 of the RF signal generated by the first RF generator. Moreover, the state S2 of an RF signal generated by a second one of the RF generators has a power level higher than the state S1 of the RF signal generated by the second RF generator. Moreover, similarly, in these embodiments, the state S1 of an RF signal generated by the first RF generator has a frequency level higher than or lower than the state S2 of the RF signal generated by the first RF generator. Moreover, the state S2 of an RF signal generated by the second RF generator has a frequency level higher than or lower than the state S1 of the RF signal generated by the second RF generator.

In various embodiments, regardless of whether a power level of the RF signal during the state S2 is greater than or lower than a power level of the RF signal during the state S1, a frequency level of the RF signal during the state S2 is greater than or lower than a frequency level of the RF signal during the state S1.

In some embodiments, a level, e.g., a frequency level, a power level, etc., as used herein includes one or more values, and a level of a first state, e.g., the state S1, the state S2, etc., has values exclusive of values of a level of a second state, e.g., the state S1, the state S2, etc., that is different from the first state. For example, none of power values of an RF signal during the state S1 are the same as power values of the RF signal during the state S2. As another example, none of frequency values of an RF signal during the state S1 are the same as frequency values of the RF signal during the state S2.

In several embodiments, a state transition refers to a transition between two frequency levels of the RF signal. For example, the state transition ST1 is a transition from one frequency level of the state S1 of the RF signal to another frequency level of the state S2 of the RF signal. As another example, the state transition ST2 is a transition from the other frequency level of the state S2 of the RF signal to the frequency level of the state S1 of the RF signal.

In various embodiments, the RF generator 104 receives a clock signal from the processor 134 or from a clock source, e.g., an oscillator, etc., within the host computer system 110 and alternates between the states S1 and S2 in synchronization with the clock signal. To illustrate, when the clock signal pulses is high, the RF generator 104 generates the RF signal having the state S1 and when the clock signal is low, the RF generator 104 generates the RF signal having the state S2. The RF generator 104 receives the recipe via a network cable 138 that is connected to the RF generator 104 and the host computer system 110, and a digital signal processor (DSP) of the RF generator 104 provides the recipe to the RF power supply 122. The RF power supply 122 generates the RF signal that has the radio frequency RF1(S1) and the power level prescribed in the recipe.

The impedance matching network 106 is initialized to have the combined variable capacitance C1. For example, the processor 134 sends a signal to the driver of the drive assembly 112 to generate one or more current signals. The one or more current signals are generated by the driver and sent to corresponding one or more stators of corresponding one or more motors of the drive assembly 112. One or more rotors of the drive assembly 112 that are in electrical field contact with the corresponding one or more stators rotate to move the connection mechanism 114 to change the combined variable capacitance of the branch circuit of the impedance matching network 106 to C1. The branch circuit of the impedance matching network 106 having the combined variable capacitance C1 receives the RF signal having the radio frequency RF1(S1) from the output 126 via the input 128 and the RF cable 130 and matches an impedance of a load connected to the impedance matching network 106 with that of a source connected to the impedance matching network 106 to generate a modified signal, which is an RF signal. Examples of the load include the plasma chamber 108 and the RF transmission line 132. Examples of the source include the RF cable 130 and the RF generator 104. The modified signal is provided from the output 140 of the branch circuit of the impedance matching network 106 via the RF transmission line 132 to the chuck 118. When the modified signal is provided to the chuck 118 in conjunction with one or more process gases, e.g., oxygen containing gas, fluorine containing gas, etc., plasma is produced or is maintained in a gap between the chuck 118 and the upper electrode 116.

When the RF signal having the radio frequency RF1(S1) is generated and the impedance matching network 106 has the combined variable capacitance C1, the sensor 124 senses a voltage reflection coefficient $\Gamma mi1(S1)$ at the output 126 and provides the voltage reflection coefficient via the network cable 136 to the processor 134. An example of a voltage reflection coefficient includes a ratio of voltage reflected towards the RF generator 104 from the plasma chamber 108 and voltage supplied within the RF signal generated by the RF generator 104. The processor 134 calculates an impedance $Zmi1(S1)$ from the voltage reflection coefficient $\Gamma mi1(S1)$. For example, the processor 134 calculates the impedance $Zmi1(S1)$ by applying an equation (1), which is $\Gamma mi1(S1)=(Zmi1(S1)-Zo)/(Zmi1(S1)+Zo)$, and solving for $Zmi1(S1)$, where Zo is a characteristic impedance of the RF transmission line 132. The impedance Zo is provided to the processor 134 via the input device, e.g., a mouse, a keyboard, a stylus, a keypad, a button, a touch screen, etc., that is connected to the processor 134 via an input/output interface, e.g., a serial interface, a parallel interface, a USB interface, etc. In some embodiments, the sensor 124 measures the impedance $Zmi1(S1)$ and provides the impedance $Zmi1(S1)$ via the network cable 136 to the processor 134.

The impedance $Zmi1(S1)$ is applied by the processor 134 to an input 142 of the model system 102 and is forward propagated via the model system 102 to calculate a load impedance $ZL1(S1)$ at an output 144 of the model system 102. The model system 102 is initialized to have the combined variable capacitance C1 and the radio frequency value RF1(S1). For example, the impedance $Z1(S1)$ is forward propagated by the processor 144 via one or more circuit elements of the model system 102 to generate the load impedance $ZL1(S1)$. To illustrate, the model system 102 is initialized to have the radio frequency RF1(S1) and the combined variable capacitance C1. When the model system 102 includes a series combination of a resistive element, an inductive element, a fixed capacitive element, and a variable capacitive element, the processor 134 calculates a directional sum of the impedance Zmi1(S1) received at the input 142 of the model system 102, a complex impedance across the resistive element, a complex impedance across the inductive element, and a complex impedance across the variable capacitive element having the variable capacitance C1, and a complex impedance across the fixed capacitive element to generate the load impedance ZL1(S1).

In various embodiments, instead of measuring a voltage reflection coefficient at the output 126, a voltage reflection coefficient is measured at any point, on the RF cable 130, from and including the output 126 to the input 128. For example, the sensor 124 is connected to the point between RF power supply 122 and the impedance matching network 106 to measure a voltage reflection coefficient.

Figure 2:
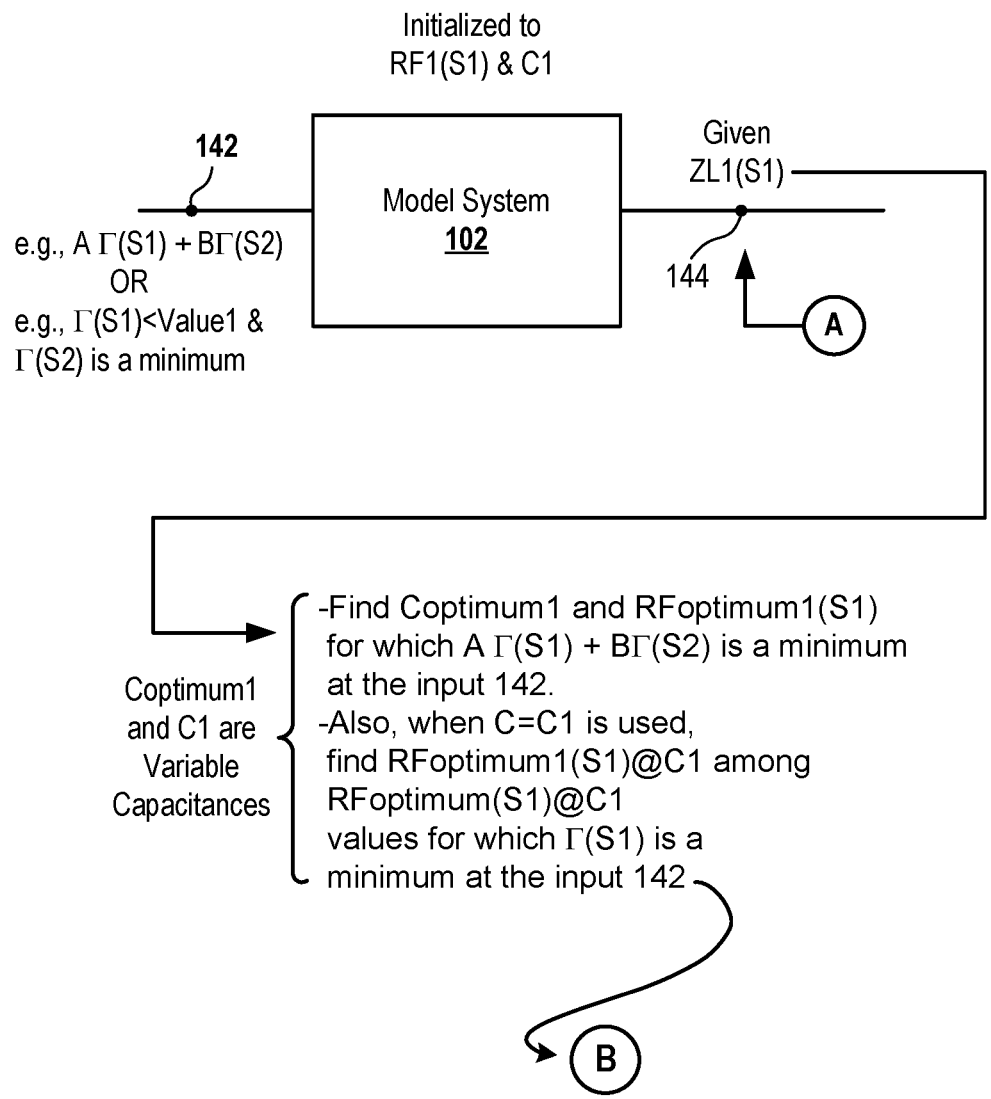
FIG. 2 is a diagram of an embodiment of the model system that is initialized to have a radio frequency RF1(S1) and a variable capacitance C1 to determine a variable capacitance and/or a radio frequency for which a combination of a voltage reflection coefficient Γ(S1) for the state S1 and a voltage reflection coefficient Γ(S2) for a state S2 at an input of the model system is minimum.

FIG. 2 is a diagram of an embodiment of the model system 102 that is initialized to have the radio frequency RF1(S1) and the variable capacitance C1 to determine a variable capacitance and/or a radio frequency for which a combination of a voltage reflection coefficient Γ(S1) for the state S1 and a voltage reflection coefficient Γ(S2) for the state S2 at the input 142 is minimum. An example of the combination of the voltage reflection coefficients Γ(S1) and Γ(S2) includes AΓ(S1)+BΓ(S2), where A and B are pre-determined coefficients that are received by the processor 134 via the input device. In some embodiments, a value of B is (1−A). Another example of the combination of the voltage reflection coefficients Γ(S1) and Γ(S2) includes the voltage reflection coefficient Γ(S1) being less than a pre-determined value, which is received by the processor 134 via the input device, and the voltage reflection coefficient Γ(S2) being a minimum from among multiple values of the voltage reflection coefficient Γ(S2).

The processor 134 calculates from the load impedance ZL1(S1) and the model system 102 a radio frequency value RFoptimum1(S1) and a combined variable capacitance value Coptimum1 for which the combination of the voltage reflection coefficients Γ(S1) and Γ(Ω) is minimum from among multiple values of the combination of the voltage reflection coefficients Γ(S1) and Γ(S2) at the input 142. For example, the processor 134 back propagates the load impedance ZL1(S1) via the model system 102, which is initialized to have the radio frequency RF1(S1) and the variable capacitance C1, to determine the radio frequency value RFoptimum1(S1) and the combined variable capacitance value Coptimum1 that generate a combination of an input impedance Z(S1) for the state S1 and Z(S2) for the state S2. For the combination of the input impedances Z(S1) and Z(S2), the combination of the voltage reflection coefficients Γ(S1) and Γ(S2) is minimum. The voltage reflection coefficient Γ(S1) is generated by the processor 134 from the input impedance Z(S1) by applying an equation (2), which is Γ(S1)=(Z(S1)−Zo)/(Z(S1)+Zo), and the voltage reflection coefficient Γ(S2) is generated by the processor 134 from the input impedance Z(S2) by applying an equation (4), which is Γ(S2)=(Z(S2)−Zo)/(Z(S2)+Zo). The back propagation is the same as the forward propagation except that the back propagation is in a direction opposite to the forward propagation.

As another example, the processor 134 varies the radio frequency values applied to the model system 102 from RFoptimum1(S1) to RFoptimumM(S1) and varies capacitance values of the model system 102, and back propagates the load impedance ZL1(S1) to solve for and determine the radio frequency RFoptimum1(S1) and the variable capacitance value Coptimum1 for which the combination of the voltage reflection coefficients Γ(S1) and Γ(S2) at the input 142 is a minimum, where M is an integer greater than 1. For example, the processor 134 back propagates the load impedance ZL1(S1) via the model system 102 when the model system 102 has the radio frequency value RFoptimum1(S1) and the variable capacitance Coptimum1 to determine that the combination of the voltage reflection coefficients Γ(S1) and Γ(S2) at the input 142 has a first value. Moreover, in the example, the processor 134 back propagates the load impedance ZL1(S1) via the model system 102 when the model system 102 has the radio frequency RFoptimum2(S1) and the variable capacitance C1 to determine that the combination of the voltage reflection coefficients Γ(S1) and Γ(S2) at the input 142 has a second value. The processor 134 determines that the first value is a minimum of the first and second values to further determine that the RFoptimum1(S1) is a radio frequency value and Coptimum1 is a variable combined capacitance value for which the combination of the voltage reflection coefficients Γ(S1) and Γ(S2) is a minimum.

In some embodiments, a non-linear least squares optimization routine is executed by the processor 134 to solve for and calculate from the load impedance ZL1(S1) and the model system 102 the radio frequency value RFoptimum1(S1) and the combined variable capacitance value Coptimum1 for which the combination of the voltage reflection coefficients Γ(S1) and Γ(52) is minimum. In various embodiments, pre-determined equations are applied by the processor 134 to solve for and calculate from the load impedance ZL1(S1) and the model system 102 the radio frequency value RFoptimum1(S1) and the combined variable capacitance value Coptimum1 for which the combination of the voltage reflection coefficients Γ(S1) and Γ(S2) is minimum.

Moreover, the processor 134 varies the radio frequency values applied to the model system 102 from RFoptimum1(S1)@C1 to RFoptimumN(S1)@C1 and back propagates the load impedance ZL1(S1) to solve for and determine the radio frequency RFoptimum1(S1)@C1 for which the voltage reflection coefficient Γ(S1) at the input 142 is a minimum, where N is an integer greater than 1. For example, the processor 134 back propagates the load impedance ZL1(S1) via the model system 102 initialized to have the variable capacitance C1 when the model system 102 has the radio frequency RFoptimum1(S1)@C1 to determine that the voltage reflection coefficient Γ(S1) has a first value. Moreover, in the example, the processor 134 back propagates the load impedance ZL1(S1) via the model system 102 initialized to have the variable capacitance C1 when the model system 102 has the radio frequency RFoptimum2(S1)@C1 to determine that the voltage reflection coefficient Γ(S1) has a second value. The processor 134 determines that the first value is a minimum of the first and second values to further determine that the RFoptimum1(S1)@C1 is a radio frequency value for which the voltage reflection coefficient Γ(S1) is a minimum. In some embodiments, a non-linear squares optimization routine is used to find the radio frequency value RFoptimum1(S1)@C1 for which the voltage reflection coefficient Γ(S1) has the minimum value.

In various embodiments, a value of a radio frequency for which the combination of the voltage reflection coefficients Γ(S1) and Γ(S2) is a minimum is referred to herein as a favorable RF value.

In several embodiments, the radio frequency value RFoptimum1(S1) is not calculated in the method described using FIG. 2.

In some embodiments, an RF value is sometimes referred to herein as a "parametric value". Moreover, a capacitance is sometimes referred to herein as a "measurable factor".

Also, a value of a reflection coefficient, e.g., a voltage reflection coefficient, etc., and a value of an impedance are examples of a parameter value.

Figure 3:
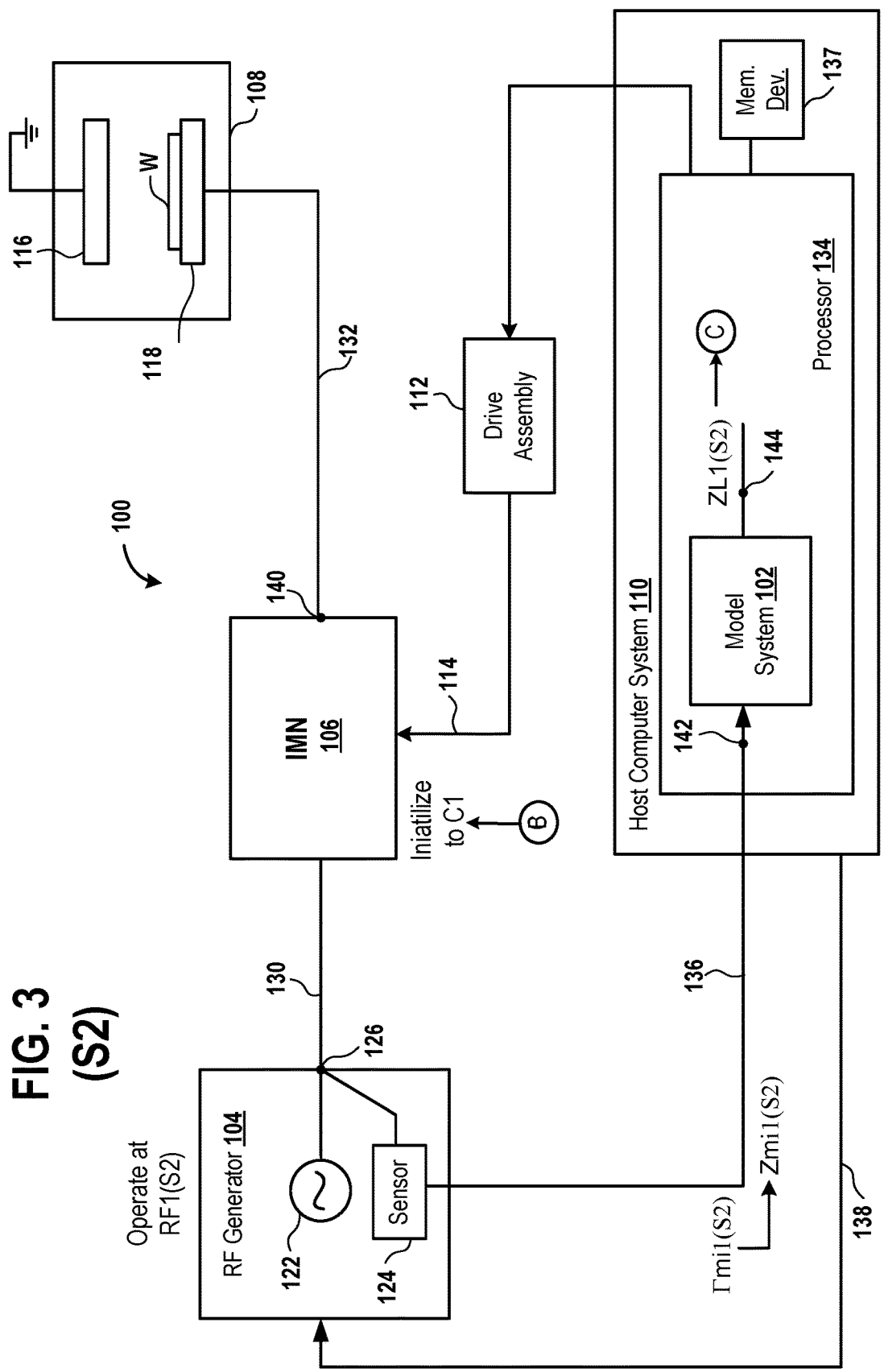
FIG. 3 is a diagram of an embodiment of the plasma system to illustrate generation of a load impedance ZL1(S2) using the model system for the state S2.

FIG. 3 is a diagram of an embodiment of the plasma system 100 to illustrate generation of a load impedance ZL1(S2) using the model system 102 for the state S2. During the state S2, the RF generator 104 is operated at a radio frequency RF1(S2) and the wafer W is placed on the top surface 120 for processing. For example, the processor 134 provides a recipe that includes the radio frequency level RF1(S2) and a power level for the state S2 to the RF generator 104. The RF generator 104 receives the recipe via the network cable 138 that is connected to the RF generator 104 and the host computer system 110, and the DSP of the RF generator 104 provides the recipe to the RF power supply 122. The RF power supply 122 generates the RF signal that has the radio frequency RF1(S2) and the power level prescribed in the recipe.

The impedance matching network 106 is initialized to have the combined variable capacitance C1. The branch circuit of the impedance matching network 106 having the combined variable capacitance C1 receives the RF signal having the radio frequency RF1(S2) from the output 126 via the input 128 and the RF cable 130 and matches an impedance of the load connected to the impedance matching network 106 with that of the source connected to the impedance matching network 106 to generate the modified signal. During the state S2, the modified signal is provided from the output 140 of the branch circuit of the impedance matching network 106 via the RF transmission line 132 to the chuck 118. When the modified signal is provided to the chuck 118 in conjunction with the one or more process gases, plasma is produced or is maintained in the gap between the chuck 118 and the upper electrode 116.

When the RF signal having the radio frequency RF1(S2) is generated and the impedance matching network 106 has the combined variable capacitance C1 during the state S2, the sensor 124 senses a voltage reflection coefficient 1 mi1(S2) at the output 126 and provides the voltage reflection coefficient via the network cable 136 to the processor 134. The processor 134 calculates an impedance Zmi1(S2) from the voltage reflection coefficient Γmi1(S2). For example, the processor 134 calculates the impedance Zmi1(S2) by applying an equation (4), which is Γmi1(S2)=(Zmi1(S2)−Zo)/(Zmi1(S2)+Zo), and solving for Zmi1(S2). In some embodiments, the sensor 124 measures the impedance Zmi1(S2) and provides the impedance Zmi1(S2) via the network cable 136 to the processor 134.

The impedance Zmi1(S2) is applied by the processor 134 to the input 142 of the model system 102 and is forward propagated via the model system 102 to calculate a load impedance ZL1(S2) at the output 144 of the model system 102. For example, the impedance Zmi1(S2) is forward propagated by the processor 144 via one or more circuit elements of the model system 102 to generate the load impedance ZL1(S2). To illustrate, the model system 102 is initialized to have the radio frequency RF1(S2) and the variable capacitance C1. When the model system 102 includes a series combination of a resistive element, an inductive element, a fixed capacitive element, and a variable capacitive element, the processor 134 calculates a directional sum of the impedance Zmi1(S2) received at the input 142 of the model system 102, a complex impedance across the resistive element, a complex impedance across the inductive element, and a complex impedance across the variable capacitive element having the variable capacitance C1, and a complex impedance across the fixed capacitive element to generate the load impedance ZL1(S2) at the output 144.

Figure 4:
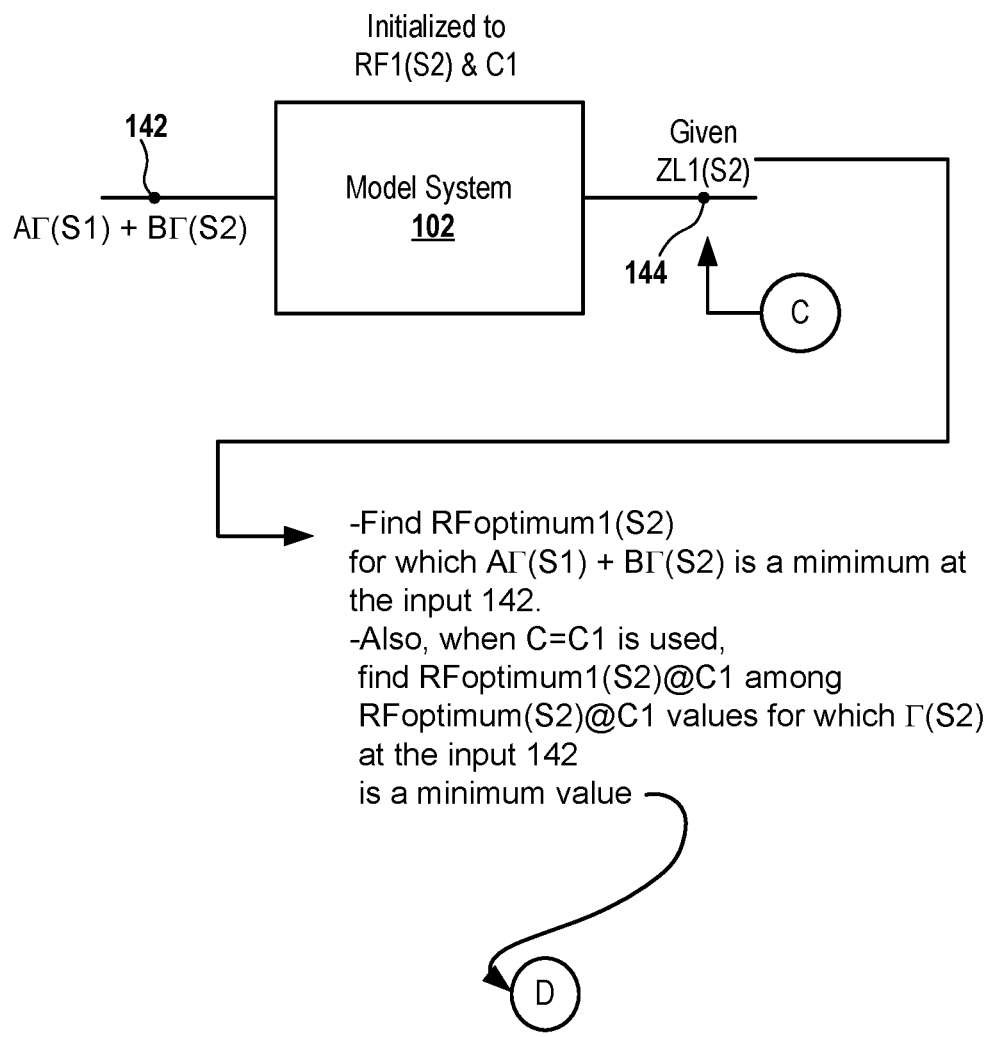
FIG. 4 is a diagram of an embodiment of the model system that is initialized to a radio frequency RF1(S2) and the variable capacitance C1 to determine a variable capacitance and/or a radio frequency for which a combination of the voltage reflection coefficient Γ(S1) for the state S1 and the voltage reflection coefficient Γ(S2) for the state S2 at the input of the model system is minimum.

FIG. 4 is a diagram of an embodiment of the model system 102 that is initialized to have the radio frequency RF1(S2) and the variable capacitance C1 to generate a variable capacitance and/or a radio frequency value for which the combination of the voltage reflection coefficient Γ(S1) for the state S1 and the voltage reflection coefficient Γ(S2) for the state S2 at the input 142 is minimum. The processor 134 calculates from the load impedance ZL1(S2) and the model system 102 a radio frequency value RFoptimum1(S2) for which the combination of the voltage reflection coefficients Γ(S1) and Γ(52) is minimum from among multiple values of the combination of the voltage reflection coefficients Γ(S1) and Γ(52). For example, the processor 134 back propagates the load impedance ZL1(S2) via the model system 102 to determine the radio frequency value RFoptimum1(S2) that generates a combination of the input impedances Z(S1) and Z(S2). For the combination of the input impedances Z(S1) and Z(S2), the combination of the voltage reflection coefficients Γ(S1) and Γ(S2) is minimum. As another example, the processor 134 varies the radio frequency values applied to the model system 102 from RFoptimum1(S2) to RFoptimumO(S2) and back propagates the load impedance ZL1(S2) to determine the radio frequency RFoptimum1(S2) for which the combination of the voltage reflection coefficients Γ(S1) and Γ(S2) is a minimum, where O is an integer greater than 1. For example, the processor 134 back propagates the load impedance ZL1(S2) via the model system 102 having the variable capacitance C1 when the model system 102 has the radio frequency RFoptimum1(S2) to determine that the combination of the voltage reflection coefficients Γ(S1) and Γ(S2) has a first value. Moreover, in the example, the processor 134 back propagates the load impedance ZL1(S2) via the model system 102 having the variable capacitance C1 when the model system 102 has the radio frequency RFoptimum2(S2) to determine that the combination of the voltage reflection coefficients Γ(S1) and Γ(S2) has a second value. The processor 134 determines that the first value is a minimum of the first and second values to further determine that the RFoptimum1(S2) is a radio frequency value for which the combination of the voltage reflection coefficients Γ(S1) and Γ(S2) is a minimum at the input 142.

In some embodiments, the radio frequency value RFoptimum1(S2) is not calculated in the method described using FIG. 4.

In various embodiments, a non-linear least squares optimization routine is executed by the processor 134 to calculate from the load impedance ZL1(S2) and the model system 102 the radio frequency value RFoptimum1(S2) for which the combination of the voltage reflection coefficients Γ(S1) and Γ(S2) is minimum at the input 142. In various embodiments, pre-determined equations are applied by the processor 134 to calculate from the load impedance ZL1(S2) and the model system 102 the radio frequency value RFoptimum1(S2) for which the combination of the voltage reflection coefficients Γ(S1) and Γ(S2) is minimum at the input 142.

Moreover, the processor 134 varies the radio frequency values applied to the model system 102 from RFoptimum1(S2)@C1 to RFoptimumP(S2)@C1 and back propagates the load impedance ZL1(S2) to determine the radio frequency RFoptimum1(S2)@C1 for which the voltage reflection coefficient Γ(S2) at the input 142 is a minimum, where P is an integer greater than 1. For example, the processor 134 back propagates the load impedance ZL1(S2) via the model system 102 having the variable capacitance C1 when the model system 102 has the radio frequency RFoptimum1(S2)@C1 to determine that the voltage reflection coefficient Γ(S2) has a first value. Moreover, in the example, the processor 134 back propagates the load impedance ZL1(S2) via the model system 102 having the variable capacitance C1 when the model system 102 has the radio frequency RFoptimum2(S2)@C1 to determine that the voltage reflection coefficient Γ(S2) has a second value. The processor 134 determines that the first value is a minimum of the first and second values to further determine that the RFoptimum1(S2)@C1 is a radio frequency value for which the voltage reflection coefficient Γ(S2) is a minimum. In some embodiments, a non-linear squares optimization routine is used to find the radio frequency value RFoptimum1(S2)@C1 for which the voltage reflection coefficient Γ(S2) has the minimum value at the input 142.

In some embodiments, the state S2 that is described with reference to FIGS. 3 and 4 is consecutive to the state S1 described with reference to FIGS. 1 and 2. For example, there is no state between the state S1 as is described using FIGS. 1 and 2, and the state S2 as is described using FIGS. 3 and 4.

Figure 5:
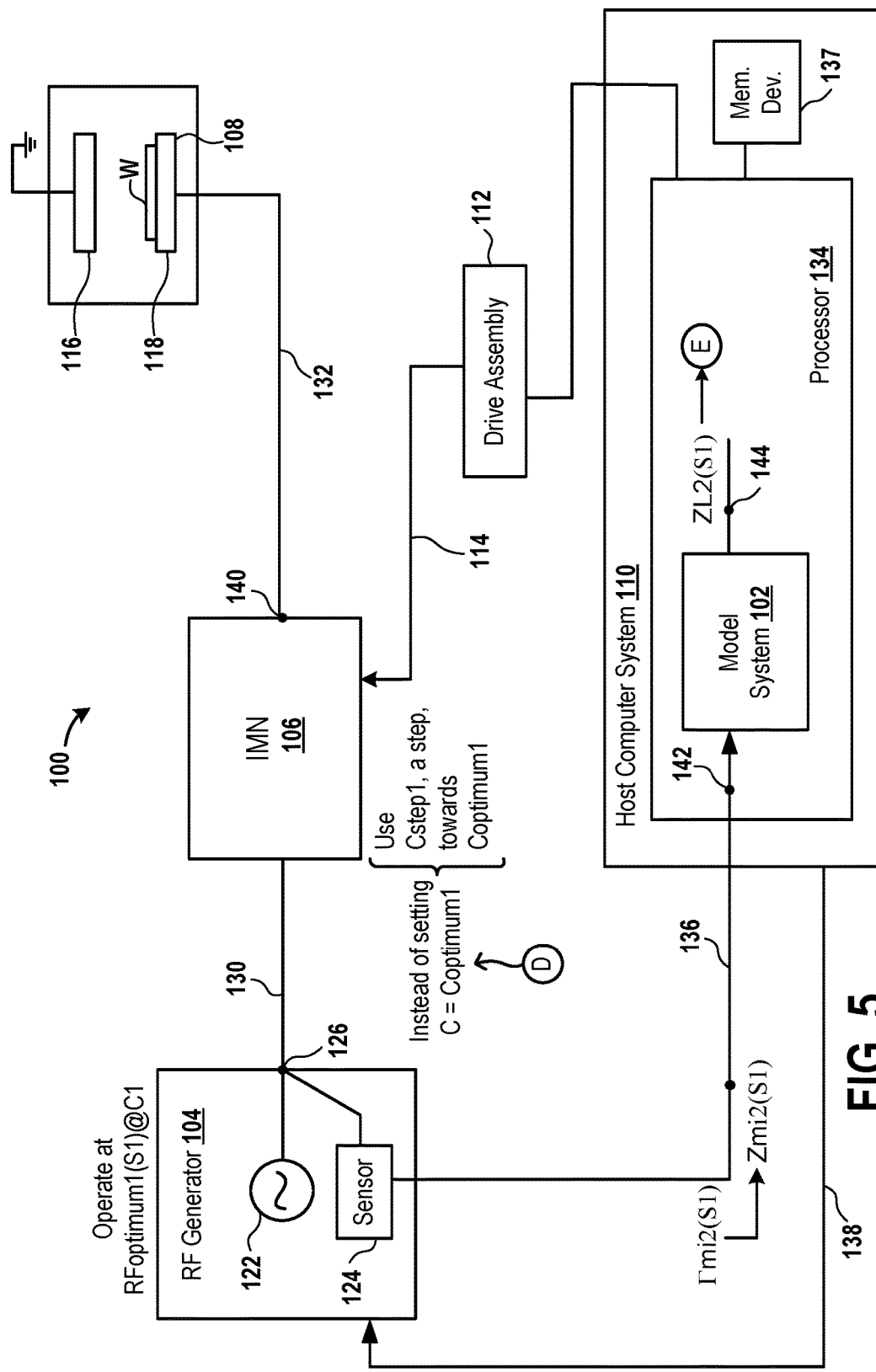
FIG. 5 is a diagram of an embodiment of the plasma system to illustrate use of a capacitance value Coptimum1 to generate a step combined variable capacitance value Cstep1 for the state S1, and use of a value RFoptimum1(S1)@C1 to generate, for the state S1, a load impedance ZL2(S1) at an output of the model system.

FIG. 5 is a diagram of an embodiment of the plasma system 100 to illustrate use of the capacitance value Coptimum1 to generate a step combined variable capacitance value Cstep1 for the state S1, and use of the value RFoptimum1(S1)@C1 to generate, for the state S1, a load impedance ZL2(S1) at the output 144 of the model system 102. The processor 134 modifies the recipe for the state S1 to include the radio frequency value RFoptimum1(S1)@C1 and provides the radio frequency value RFoptimum1(S1)@C1 to the RF generator 104. Moreover, the processor 134 determines the step variable capacitance value Cstep1 for the state S1. The step variable capacitance value Cstep1 is a step in a direction of the value Coptimum1 from the value C1. It should be noted that when one or more capacitances of corresponding one or more variable capacitors of the impedance matching network 106 are modified to change from C1 towards Coptimum1, the one or more variable capacitors move slow enough relative to changes in an RF frequency of the RF signal generated by the RF generator 104.

Instead of setting the combined variable capacitance of the impedance matching network 102 at the value Coptimum1 and instead of setting the RF generator 104 to generate the RF signal having the radio frequency RFoptimum1(S1), the processor 134 controls the drive assembly 112 so that the combined variable capacitance of the impedance matching network 102 is set at the value Cstep1 and controls the RF generator 104 to operate at the radio frequency RFoptimum1(S1)@C1. It takes a longer time, e.g., in an order of seconds, etc., for the impedance matching network 104 to achieve the variable capacitance Coptimum1 than that taken by the RF generator 104 to generate an RF signal having the radio frequency RFoptimum1(S1). For example, it takes in an order of microseconds for the RF generator 104 to achieve the radio frequency RFoptimum1(S1) from the radio frequency RF1(S1). As a result, it is difficult to directly achieve the value Coptimum1 from the value C1 simultaneous with achieving the value RFoptimum1(S1) from the value RF1(S1) so that the combination of the voltage reflection coefficients Γ(S1) and Γ(S2) at the input 126 of the RF generator 104 is a minimum. Therefore, the variable capacitance of the impedance matching network 106 is adjusted in steps, e.g., Cstep1 etc., in a direction towards the variable capacitance Coptimum1 during the state S1.

For the radio frequency RFoptimum1(S1)@C1 and the variable capacitance Cstep1, the RF generator 106 generates the RF signal having the radio frequency RFoptimum1(S1)@C1, which passes via the impedance matching network 106 to generate a modified signal, which is provided to the lower electrode 118. When the RF generator 106 generates the RF signal having the radio frequency RFoptimum1(S1)@C1 and the combined variable capacitance is Cstep1, the sensor 124 measures a voltage reflection coefficient Γmi2(S1) at the output 126 and the processor 134 generates an impedance Zmi2(S1) from the voltage reflection coefficient Γmi2(S1) in the same manner, described above, in which the impedance Zmi1(S1) is generated from the voltage reflection coefficient Γmi1(S1). Moreover, when the model system 102 is set to have the radio frequency RFoptimum1(S1)@C1 for the state S1 and the combined variable capacitance Cstep1 for the state S1, the impedance Zmi2(S1) is forward propagated via the model system 102 to generate the load impedance ZL2(S1) at the output 144 of the model system 102 in the same manner in which the load impedance ZL1(S1) is generated at the output 144 from the impedance Zmi1(S1) at the input 142 of the model system 102.

In various embodiments, the combined variable capacitance Cstep1 is closer to the combined variable capacitance Coptimum1 compared to the combined variable capacitance C1. For example, the combined variable capacitance Cstep1 is greater than the combined variable capacitance C1, and the combined variable capacitance Coptimum1 is greater than the combined variable capacitance Cstep1. As another example, the combined variable capacitance Cstep1 is less than the combined variable capacitance C1, and the combined variable capacitance Coptimum1 is less than the combined variable capacitance Cstep1.

Figure 6:
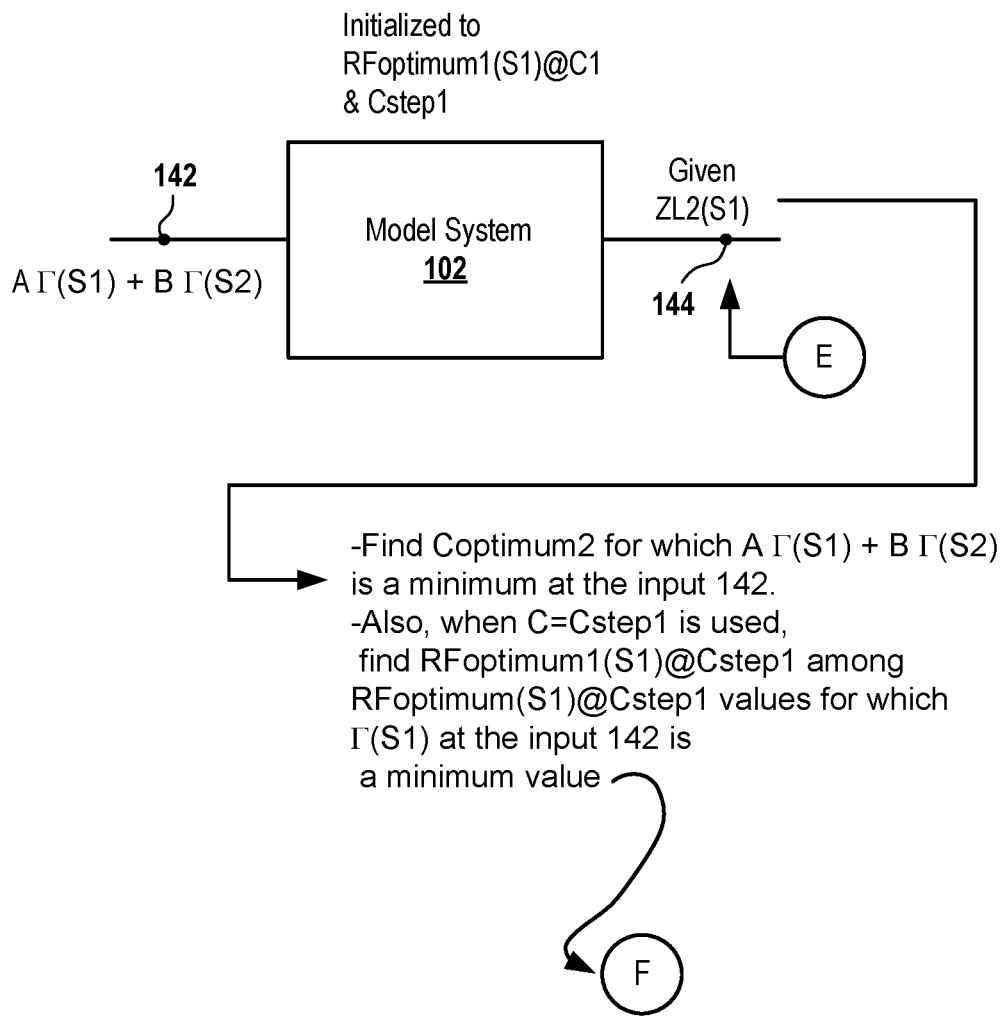
FIG. 6 is a diagram of an embodiment of the model system that is set to the radio frequency RFoptimum1(S1)@C1 for the state S1 and the combined variable capacitance Cstep1 for the state S1 to determine a radio frequency value and/or a variable capacitance value for which a combination of voltage reflection coefficients Γ(S1) and Γ(S2) at the input of the model system is minimum.

FIG. 6 is a diagram of an embodiment of the model system 102 that is set to the radio frequency RFoptimum1(S1)@C1 for the state S1 and the combined variable capacitance Cstep1 for the state S1 to determine a radio frequency value and/or a capacitance value for which a combination of the voltage reflection coefficients Γ(S1) and Γ(S2) at the input 142 is minimum. For example, the processor 142 applies the radio frequency RFoptimum1(S1)@C1 and the combined variable capacitance Cstep1 to the model system 102. As another example, the processor 142 sets values of parameters of the model system 102 as having the value RFoptimum1(S1)@C1 of radio frequency and the value Cstep1 of combined variable capacitance. In the same manner described above for calculating the combined variable capacitance Coptimum1, the processor 134 calculates from the load impedance ZL2(S1) and the model system 102 a combined variable capacitance value Coptimum2 for which the combination of the voltage reflection coefficients Γ(S1) and Γ(52) at the input 142 is a minimum.

Moreover, the processor 134 varies radio frequency values applied to the model system 102 from RFoptimum1(S1)@Cstep1 to RFoptimumQ(S1)@Cstep1 and back propagates the load impedance ZL2(S1) via the model system 102 to determine a radio frequency RFoptimum1(S1)@Cstep1 for which the voltage reflection coefficient Γ(S1) is a minimum, where Q is an integer greater than 1. For example, the processor 134 back propagates the impedance ZL2(S1) via the model system 102 set to the variable capacitance Cstep1 and the radio frequency RFoptimum1(S1)@Cstep1 to determine that the voltage reflection coefficient Γ(S1) has a first value. Moreover, in the example, the processor 134 back propagates the impedance ZL2(S1) via the model system 102 set to have the variable capacitance Cstep1 and the radio frequency RFoptimum2(S1)@Cstep1 to determine that the voltage reflection coefficient Γ(S1) has a second value. The processor 134 determines that the first value is a minimum of the first and second values to further determine that the RFoptimum1(S1)@Cstep1 is a radio frequency value for which the voltage reflection coefficient Γ(S1) at the input 142 is a minimum.

In some embodiments, the state S1 that is described with reference to FIGS. 5 and 6 is consecutive to the state S2 described with reference to FIGS. 3 and 4. For example, there is no state between the state S2 as is described using FIGS. 3 and 4, and the state S1 as is described using FIGS. 5 and 6.

Figure 7:
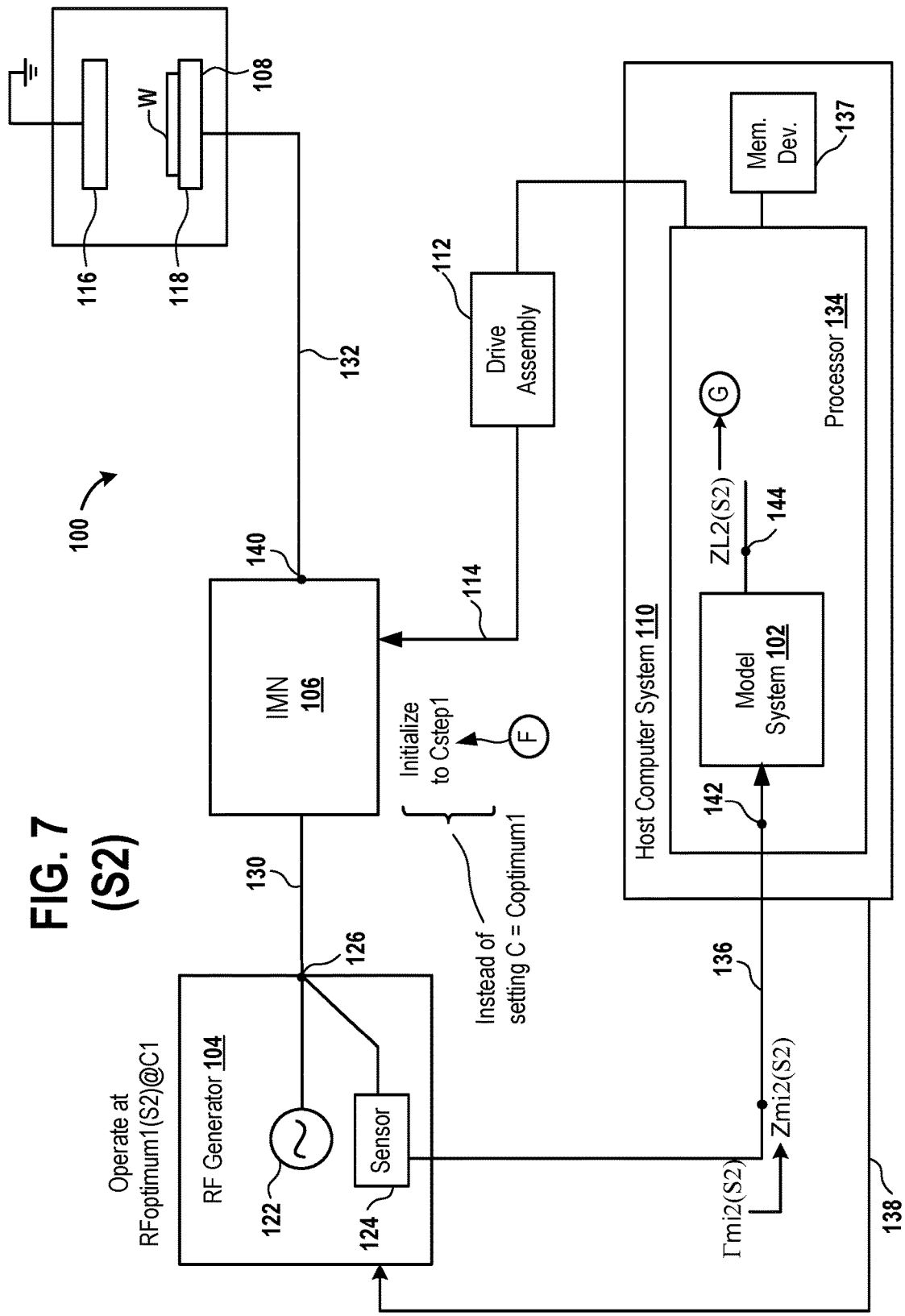
FIG. 7 is a diagram of an embodiment of the plasma system to illustrate use of the capacitance value Coptimum1 to generate the step combined variable capacitance value Cstep1 for the state S2, and use of a value RFoptimum1(S2)@C1 to generate, for the state S2, a load impedance ZL2(S2) at the output of the model system.

FIG. 7 is a diagram of an embodiment of the plasma system 100 to illustrate use of the capacitance value Coptimum1 to generate the step combined variable capacitance value Cstep1 for the state S2, and use of the value RFoptimum1(S2)@C1 to generate, for the state S2, a load impedance ZL2(S2) at the output 144 of the model system 102. The processor 134 modifies the recipe for the state S2 to include the radio frequency value RFoptimum1(S2)@C1 and provides the radio frequency value RFoptimum1(S2)@C1 to the RF generator 104. Moreover, the processor 134 determines that the step variable capacitance value Cstep1 for the state S2 is to be applied to the impedance matching network 106.

Instead of setting the combined variable capacitance of the impedance matching network 102 at the value Coptimum1 and instead of setting the RF generator 104 to generate the RF signal having the radio frequency RFoptimum1(S2), the processor 134 controls the drive assembly 112 so that the combined variable capacitance of the impedance matching network 102 is set at the value Cstep1 and controls the RF generator 104 to operate at the radio frequency RFoptimum1(S2)@C1. It takes a longer time, e.g., in an order of seconds, etc., for the impedance matching network 104 to achieve the variable capacitance Coptimum1 than that taken by the RF generator 104 to generate an RF signal having the radio frequency RFoptimum1(S2). For example, it takes in an order of microseconds for the RF generator 104 to achieve the radio frequency RFoptimum1(S2) from the radio frequency RF1(S2). As a result, it is difficult to directly achieve the value Coptimum1 from the value C1 simultaneous with achieving the value RFoptimum1(S2) from the value RF1(S2) so that the combination of the voltage reflection coefficients Γ(S1) and Γ(S2) at the input 126 of the RF generator 104 is a minimum. Therefore, the variable capacitance of the impedance matching network 106 is adjusted in steps, e.g., Cstep1 etc., in a direction towards the variable capacitance Coptimum1 during the state S2.

For the radio frequency RFoptimum1(S2)@C1 and the variable capacitance Cstep1, the RF generator 106 generates the RF signal having the radio frequency RFoptimum1(S2)@C1, and the RF signal passes via the impedance matching network 106 to generate the modified signal, which is provided to the lower electrode 118. When the RF generator 106 generates the RF signal having the radio frequency RFoptimum1(S2)@C1 and the combined variable capacitance is Cstep1, the sensor 124 measures a voltage reflection coefficient Γmi2(S2) at the output 126 and the processor 134 generates an impedance Zmi2(S2) from the voltage reflection coefficient Γmi2(S2) in the same manner, described above, in which the impedance Zmi1(S1) is generated from the voltage reflection coefficient Γmi1(S1). Moreover, when the model system 102 is set to have the radio frequency RFoptimum1(S2)@C1 and the variable capacitance Cstep1, and the impedance Zmi2(S2) is forward propagated via the model system 102 to generate the load impedance ZL2(S2) at the output 144 of the model system 102 in the same manner in which the load impedance ZL1(S2) is generated at the output 144 from the impedance Zmi1(S2) at the input 142 of the model system 102.

Figure 8:
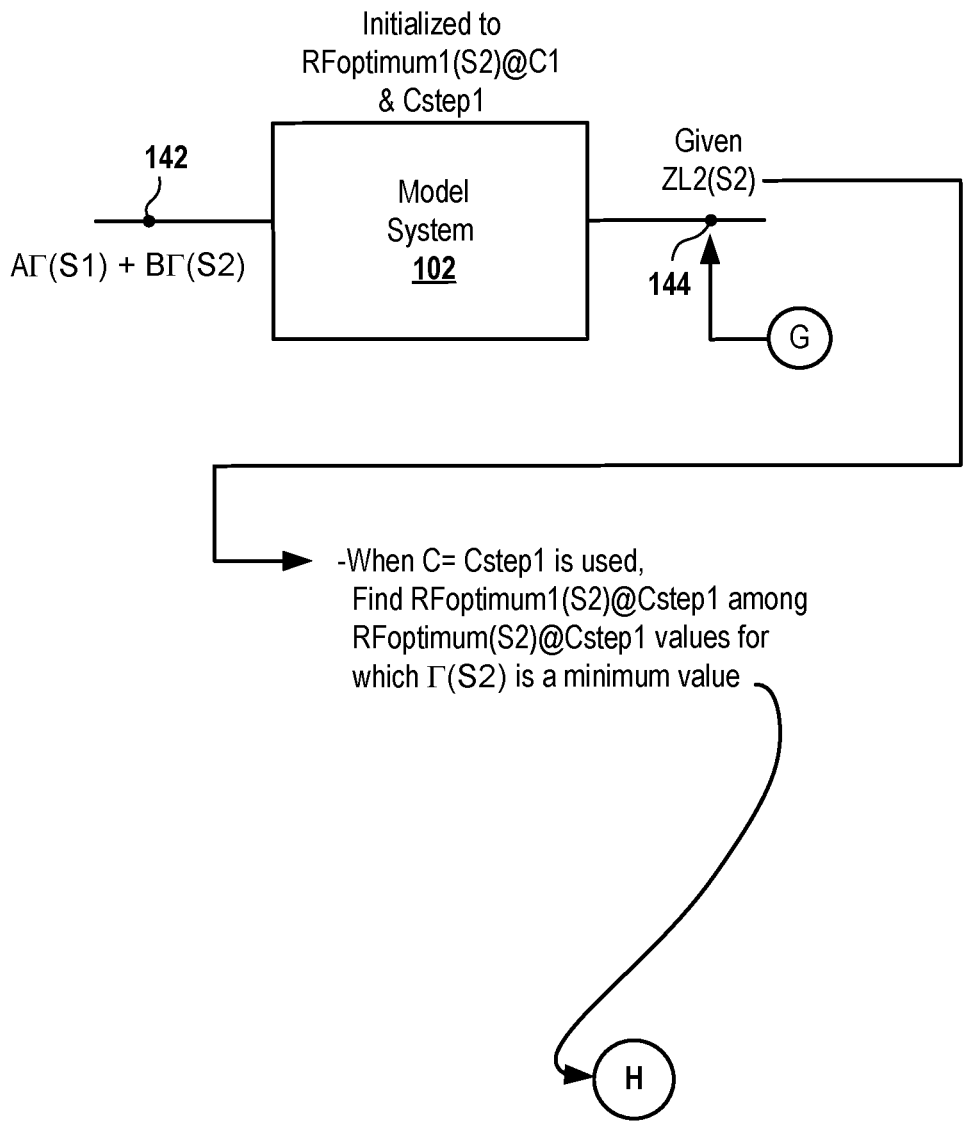
FIG. 8 is a diagram of an embodiment of the model system that is set to the radio frequency RFoptimum1(S2)@C1 for the state S2 and the combined variable capacitance Cstep1 for the state S2 to generate a minimum value of combination of the voltage reflection coefficients Γ(S1) and Γ(S2) at the input of the model system.

FIG. 8 is a diagram of an embodiment of the model system 102 that is set to the radio frequency RFoptimum1(S2)@C1 for the state S2 and the combined variable capacitance Cstep1 for the state S2 to generate a minimum value of combination of the voltage reflection coefficients Γ(S1) and Γ(S2) at the input 142. For example, the processor 142 applies the radio frequency RFoptimum1(S2)@C1 and the combined variable capacitance Cstep1 to the model system 102. As another example, the processor 142 sets values of parameters of the model system 102 as having the value RFoptimum1(S2)@C1 of radio frequency and the value Cstep1 of combined variable capacitance. The processor 134 varies radio frequency values applied to the model system 102 from RFoptimum1(S2)@Cstep1 to RFoptimumR(S2)@Cstep1 and back propagates the load impedance ZL2(S2) to determine a radio frequency RFoptimum1(S2)@Cstep1 for which the voltage reflection coefficient Γ(S2) at the input 142 is a minimum, where R is an integer greater than 1. For example, the processor 134 back propagates the impedance ZL2(S2) via the model system 102 having the variable capacitance Cstep1 and the radio frequency RFoptimum1(S2)@Cstep1 to determine that the voltage reflection coefficient Γ(S2) has a first value. Moreover, in the example, the processor 134 back propagates the impedance ZL2(S2) via the model system 102 having the variable capacitance Cstep1 and the radio frequency RFoptimum2(S2)@Cstep1 to determine that the voltage reflection coefficient Γ(S2) has a second value. The processor 134 determines that the first value is a minimum of the first and second values to further determine that the RFoptimum1(S2)@Cstep1 is a radio frequency value for which the voltage reflection coefficient Γ(S2) is a minimum at the input 142.

In some embodiments, the state S2 that is described with reference to FIGS. 7 and 8 is consecutive to the state S1 described with reference to FIGS. 5 and 6. For example, there is no state between the state S1 as is described using FIGS. 5 and 6, and the state S2 as is described using FIGS. 7 and 8.

Figure 9:
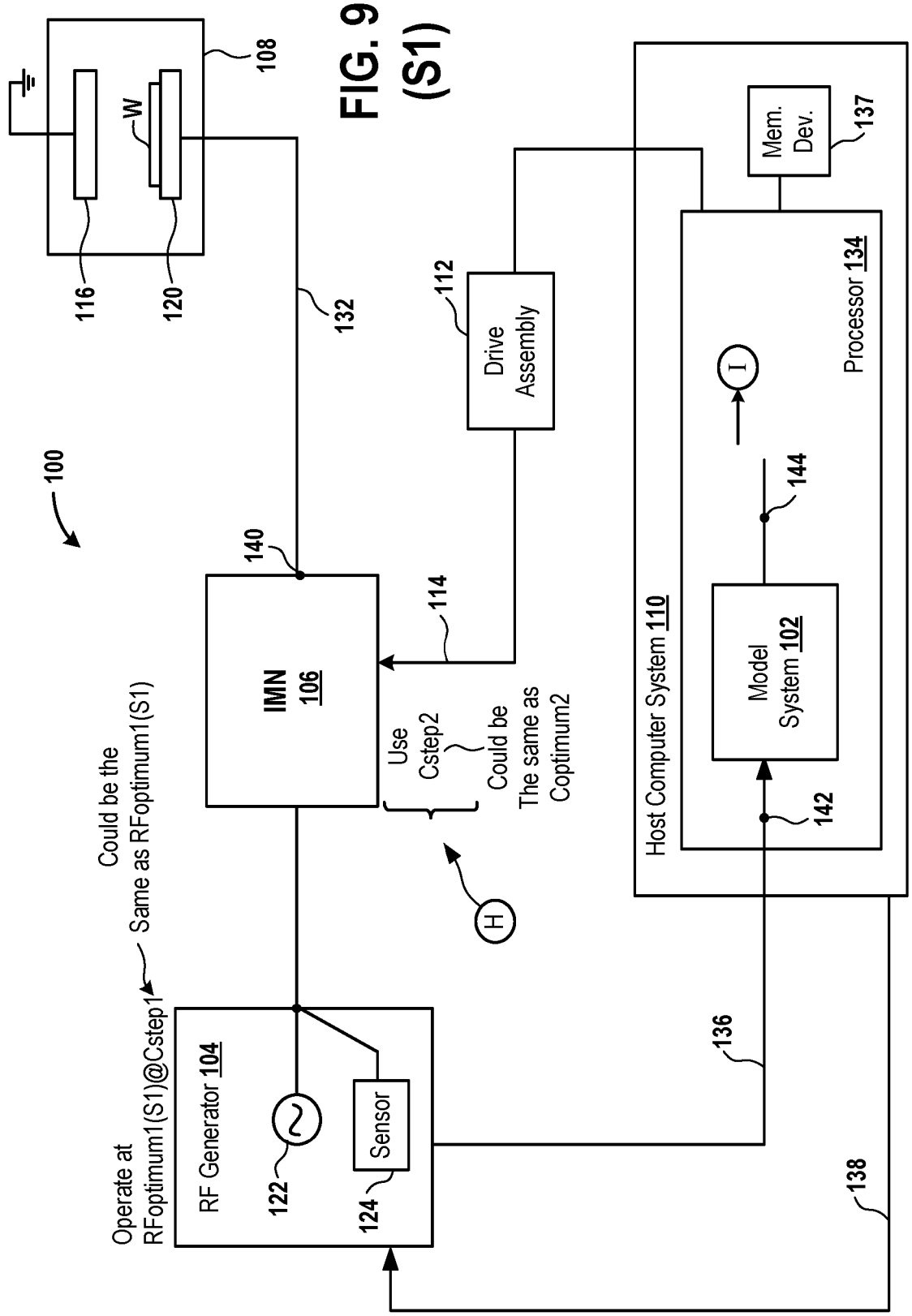
FIG. 9 is a diagram of an embodiment of the plasma system to illustrate use of a capacitance value Coptimum2, and use of a value RFoptimum1(S1)@Cstep1 to process a wafer W during the state S1.

FIG. 9 is a diagram of an embodiment of the system 100 to illustrate use of the capacitance value Coptimum2, and use of the value RFoptimum1(S1)@Cstep1 to process the wafer W during the state S1. The processor 134 modifies the recipe for the state S1 to include the radio frequency value RFoptimum1(S1)@Cstep1 and provides the radio frequency value RFoptimum1(S1)@Cstep1 to the RF generator 104. Moreover, the processor 134 controls the drive assembly 112 so that the combined variable capacitance of the impedance matching network 102 is set at the value Cstep2. It should be noted that in some embodiments, the value RFoptimum1(S1)@Cstep1 is the same as the value RFoptimum1(S1). Moreover, in various embodiments, the combined variable capacitance Cstep2 is the same as the combined variable capacitance Coptimum2.

During the state S1, when the combined variable capacitance of the impedance matching network 106 is Cstep2, the RF generator 106 generates the RF signal having the radio frequency RFoptimum1(S1)@Cstep1. The RF signal having the radio frequency RFoptimum1(S1)@Cstep1 passes via the impedance matching network 106 to generate the modified signal, which is provided to the lower electrode 118 for processing the wafer W during the state S1.

In some embodiments, instead of generating an impedance, e.g., the impedance Zmi1(S1), Zmi2(S1), etc., for the state S1 from a voltage reflection coefficient, e.g., Γmi1(S1), Γmi2(S1), etc., received from the sensor 124 for the state S1, the processor 134 receives the voltage reflection coefficient to generate a corresponding load voltage reflection coefficient impedance, e.g., ΓL1(S1), ΓL2(S1), etc., at the output 144 of the model system 102. The corresponding load voltage reflection coefficient is applied at the output 144 of the model system 102 in the same manner in which the load impedance, e.g., ZL1(S1), ZL2(S1), etc., for the state S1 is applied at the output of the model system 102. There is no need to convert from a voltage reflection coefficient to impedance and vice versa.

In various embodiments, the combined variable capacitance Cstep2 is closer to the combined variable capacitance Coptimum2 compared to the combined variable capacitance Cstep1. For example, the combined variable capacitance Cstep2 is greater than the combined variable capacitance Cstep1, and the combined variable capacitance Coptimum2 is greater than the combined variable capacitance Cstep2. As another example, the combined variable capacitance Cstep2 is less than the combined variable capacitance Cstep1, and the combined variable capacitance Coptimum2 is less than the combined variable capacitance Cstep2.

In some embodiments, the state S1 that is described with reference to FIG. 9 is consecutive to the state S2 described with reference to FIG. 8. For example, there is no state between the state S2 as is described using FIG. 8, and the state S1 as is described using FIG. 9.

Figure 10:
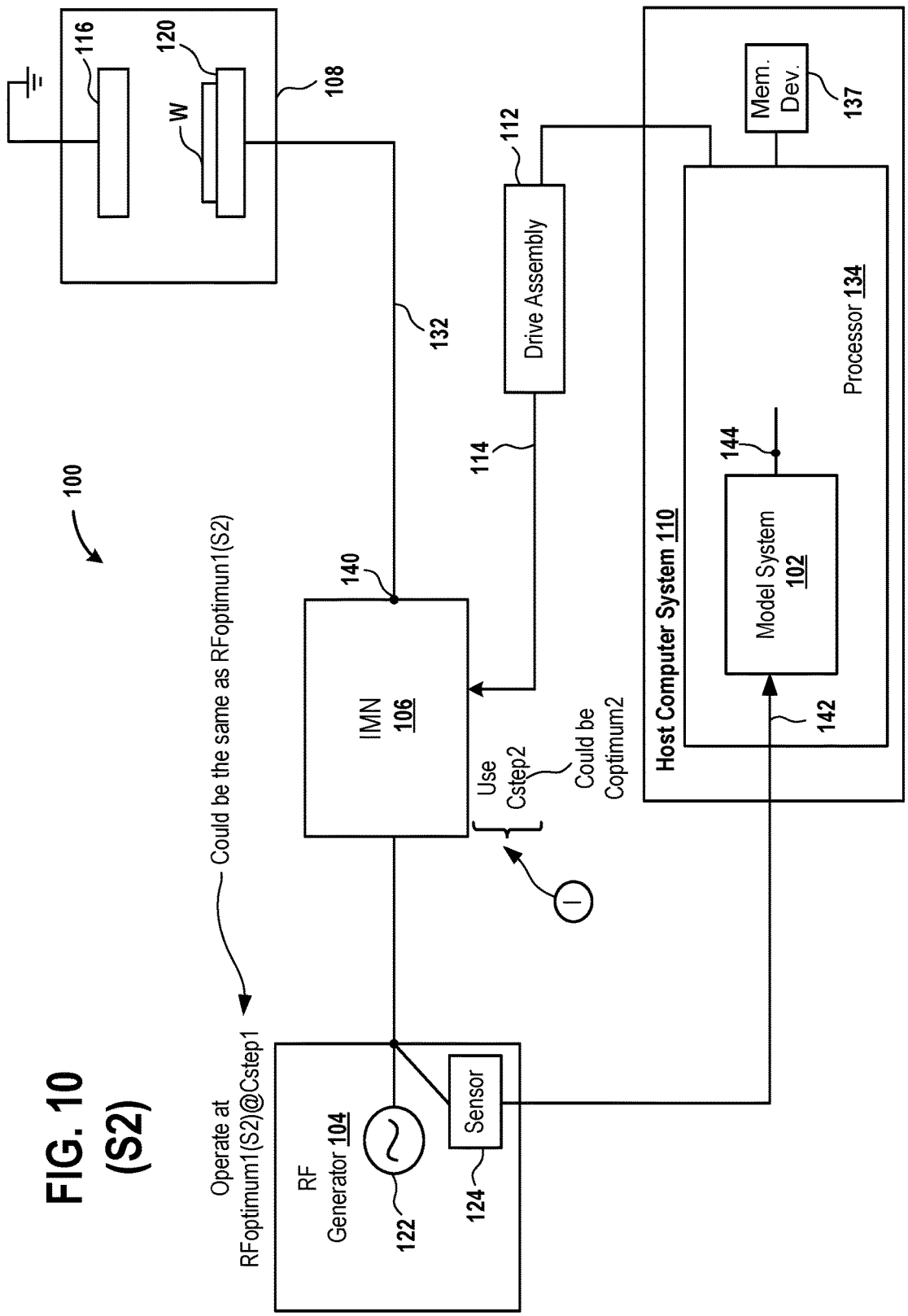
FIG. 10 is a diagram of an embodiment of the plasma system to illustrate use of the capacitance value Coptimum2, and use of a value RFoptimum1(S2)@Cstep1 to process the wafer W during the state S2.

FIG. 10 is a diagram of an embodiment of the plasma system 100 to illustrate use of the capacitance value Coptimum2, and use of the value RFoptimum1(S2)@Cstep1 to process the wafer W during the state S2. The processor 134 modifies the recipe for the state S2 to include the radio frequency value RFoptimum1(S2)@Cstep1 and provides the radio frequency value RFoptimum1(S2)@Cstep1 to the RF generator 104. Moreover, the processor 134 controls the drive assembly 112 so that the combined variable capacitance of the impedance matching network 102 is set at the value Cstep2. It should be noted that in some embodiments, the value RFoptimum1(S2)@Cstep1 is the same as the value RFoptimum1(S2) for the state S2.

During the state S2, when the combined variable capacitance of the impedance matching network 106 is Cstep2, the RF generator 106 generates the RF signal having the radio frequency RFoptimum1(S2)@Cstep1. The RF signal having the radio frequency RFoptimum1(S2)@Cstep1 passes via the impedance matching network 106 to generate the modified signal, which is provided to the lower electrode 118 for processing the wafer W during the state S2.

In some embodiments, instead of generating an impedance, e.g., the impedance Zmi1(S2), Zmi2(S2), etc., for the state S2 from a voltage reflection coefficient, e.g., Γmi1(S2), Γmi2(S2), etc., received from the sensor 124 for the state S2, the processor 134 receives the voltage reflection coefficient to generate a corresponding load voltage reflection coefficient impedance, e.g., ΓL1(S2), ΓL2(S2), etc., at the output 144 of the model system 102. The corresponding load voltage reflection coefficient is applied at the output 144 of the model system 102 in the same manner in which the load impedance, e.g., ZL1(S2), ZL2(S2), etc., for the state S2 is applied at the output of the model system 102. There is no need to convert from a voltage reflection coefficient to impedance and vice versa.

In this manner, for the states S1 and S2, instead of applying the radio frequency RFoptimum1(S1) directly from the radio frequency RF1(S1), instead of applying the radio frequency RFoptimum1(S2) directly from the radio frequency RF1(S2), and instead of applying the combined variable capacitance value Coptimum2 directly from the combined variable capacitance value C1, a step approach in which the combined variable capacitance value Cstep1 is applied with the radio frequency RFoptimum1(S1)@C1 first for the state S1, followed by applying the combined variable capacitance value Cstep1 with the radio frequency RFoptimum1(S2)@C1 for the state S2 second, followed by applying the combined variable capacitance value Cstep2 with the radio frequency RFoptimum1(S1)@Cstep1 for the state S1 third, followed by applying the combined variable capacitance value Cstep2 with the radio frequency RFoptimum1(S2)@Cstep1 for the state S2 fourth. For example, the application of the combined variable capacitance value Cstep2 and the radio frequency RFoptimum1(S1)@Cstep1 precedes the application of the combined variable capacitance value Cstep2 with the radio frequency RFoptimum1(S2)@Cstep1. Also, the application of the combined variable capacitance value Cstep1 with the radio frequency RFoptimum1(S2)@C1 precedes the application of the combined variable capacitance value Cstep2 and the radio frequency RFoptimum1(S1)@Cstep1. The application of the combined variable capacitance value Cstep1 with the radio frequency RFoptimum1(S1)@C1 precedes the application of the combined variable capacitance value Cstep1 with the radio frequency RFoptimum1(S2)@C1.

In some embodiments, the state S2 that is described with reference to FIG. 10 is consecutive to the state S1 described with reference to FIG. 9. For example, there is no state between the state S1 as is described using FIG. 9, and the state S2 as is described using FIG. 10.

Figure 11:
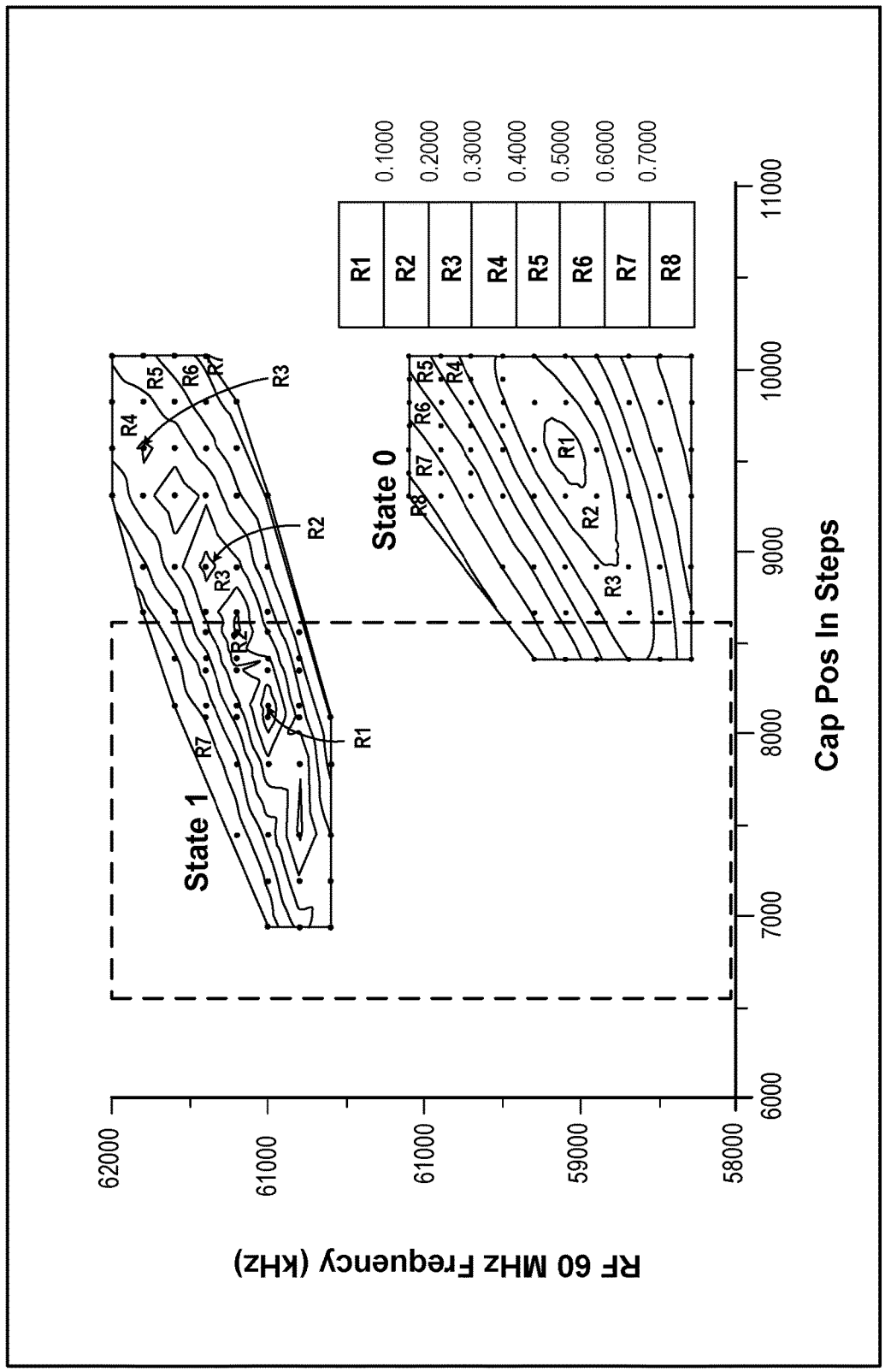
FIG. 11 is an embodiment of a graph to illustrate a compromise between achieving a minimum value of a voltage reflection coefficient for the state S1 and a minimum value of a voltage reflection coefficient for the state S2.

FIG. 11 is an embodiment of a graph 1100 to illustrate a compromise between achieving a minimum value of a voltage reflection coefficient for the state S1 and a minimum value of a voltage reflection coefficient for the state S2. The graph 1100 illustrates that it is difficult to tune four values, e.g., a real part of the voltage reflection coefficient Γ(S1), an imaginary part of the voltage reflection coefficient Γ(S1), a real part of the voltage reflection coefficient Γ(S2), and an imaginary part of the voltage reflection coefficient Γ(S2), etc., with three variable parameters, e.g., an RF frequency of the RF signal generated by the RF generator 104 in the state S1, an RF frequency of the RF signal generated by the RF generator 104 in the state S2, and a position of a variable capacitor, within the impedance matching network 106, having the combined variable capacitance, etc. In some embodiments, the impedance matching network 106 has one variable capacitor that has the combined variable capacitance. There is no single value of the position of the variable capacitor for which the voltage reflection coefficients Γ(S1) and Γ(S2) are simultaneously zero. Rather, a compromise value, e.g., the value AΓ(S1)+BΓ(S2), etc., is used.

The graph 1100 illustrates contours of F for a two-state, e.g., the state S1, the state S2, etc., pulsing plasma. The contours are of regions R1, R2, R3, R4, R5, R6. R7, and R8. Each state has its own RF frequency and share the same value of the combined variable capacitance for a clock cycle of the clock signal. The model system 102 is applied to pick the three values, e.g. an RF frequency of the RF signal generated by the RF generator 104 for the state S1, an RF frequency of the RF signal for the state S2, and the combined variable capacitance, etc., that optimizes some function of the voltage reflection coefficients Γ(S1) and Γ(52). For example, when the RF signal during the state S1 has a high level of power compared to the RF signal during the state S2, the RF signal is tuned during the state S1, and so a value of 0.8 Γ(S1)+0.2 Γ(S2) at the input 142 of the model system 102 is minimized, where 0.8 is an example of the coefficient A and 0.2 is an example of the coefficient (1-A).

The graph 1100 plots a frequency of an RF signal generated by the 60 MHz RF generator for the states S1, e.g., a state 1, etc., and S2, e.g., a state 2, etc., versus a position of a combined variable capacitance of the impedance matching network 106. As shown in the graph 1100, it is difficult to determine the combined variable capacitance of the impedance matching network 106 for which the minimum value of the voltage reflection coefficient for the state S1 and the minimum value of the voltage reflection coefficient for the state S2 are achieved. Hence, a compromise, e.g., AΓ(S1)+BΓ(S2), etc., is used instead of achieving the minimum value of a voltage reflection coefficient for the state S1 and the minimum value of a voltage reflection coefficient for the state S2.

Figure 12:
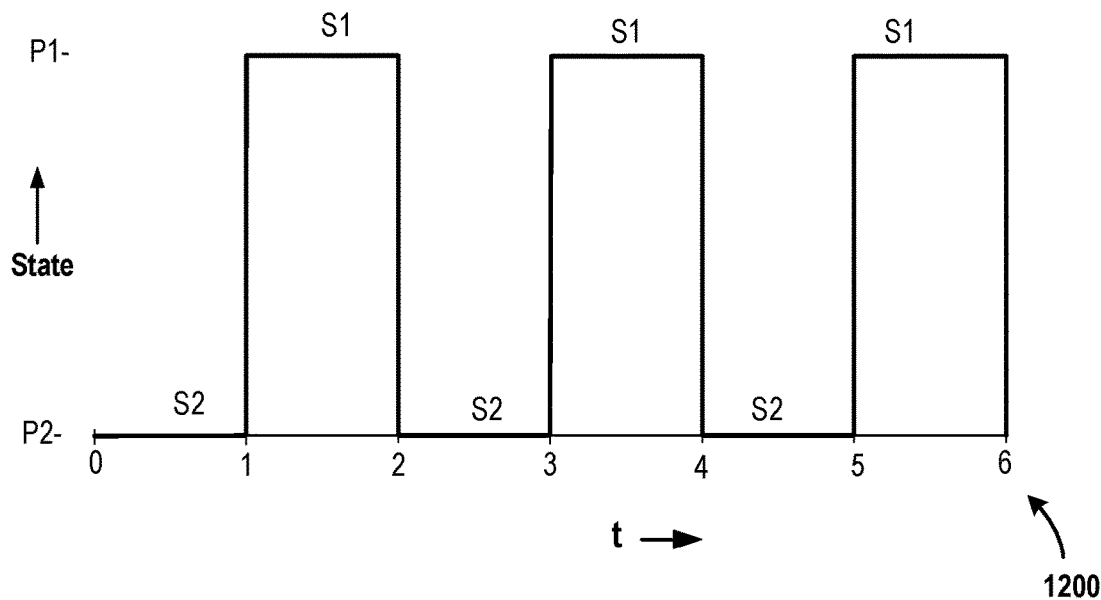
FIG. 12 is an embodiment of a graph to illustrate the two states S1 and S2 of an RF signal that is generated by an RF generator.

FIG. 12 is an embodiment of a graph 1200 to illustrate the two states S1 and S2 of an RF signal that is generated by the RF generator 104 (FIG. 1). The graph 1200 plots a power level versus time t. As shown in the graph 1200, there are the two states S1 and S2. The state S1 has one RF power level, e.g., RF signal power envelope, etc., of the RF signal that is generated by the RF generator 104 and/or an RF frequency level of the RF signal. The state S2 has another RF power level of the RF signal that is generated by the RF generator 104 compared to the power level of the state S1 and/or a different RF frequency level of the RF signal compared to the frequency level of the state S1. Both states S1 and S2 share the same value of the variable capacitor, within the impedance matching network 106, having the combined variable capacitance during a clock cycle of the clock signal. The impedances, e g, Zmi1(S1), Zmi1(S2), Zmi2(S1), Zmi2(S2), etc., for the states S1 and S2 are measured separately, and the corresponding load impedances, e.g., ZL1(S1), ZL1(S2), ZL2(S1), ZL2(S2), etc., are applied to the model system 102 separately to choose a compromise value of the variable capacitor, and then to tune the two RF frequencies for the two states S1 and S2.

As shown, the state S1 has a power level P1 and the state S2 has a power level P2. For example, the power level P1 is an envelope of the RF signal, e.g., a sinusoidal signal, etc., during the state S1 and the power level P2 is an envelope of the RF signal during the state S2. As another example, all power amounts of the RF signal during the state S2 have lower values than power amounts of the RF signal during the state S1. The power level P1 is greater than the power level P2.

Figure 13:
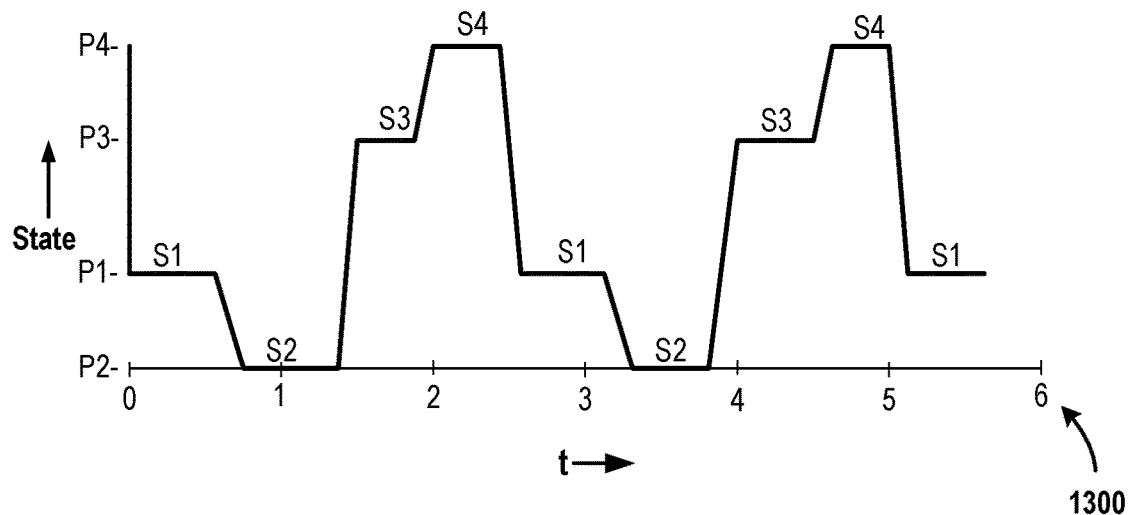
FIG. 13 is an embodiment of a graph to illustrate more than two states of an RF signal generated by the RF generator.

FIG. 13 is an embodiment of a graph 1300 to illustrate more than two states of an RF signal generated by the RF generator 104 (FIG. 1). As shown in the graph 1300, plasmas are operated with multiple RF states, e.g., S1, S2, S3, S4, etc. Setting a position value of the variable capacitor having the combined variable capacitance becomes more complex as the number of states increases, however, in some embodiments in which the four states S1 through S4 are used, five parameters, e.g., four RF frequencies, one for each of the four states, of the RF signal generated by the RF generator 104, a capacitor value of the variable capacitor having the combined variable capacitance, etc., are used to minimize a predetermined function of four values of the voltage reflection coefficient, e.g., Γ(S1), Γ(S2), Γ(S3), Γ(S4), etc., where Γ(S3) is the voltage reflection coefficient for the state S3 at the input 142 (FIG. 2) of the model system 102, and Γ(S4) is the voltage reflection coefficient for the state S4 at the input 142 (FIG. 2) of the model system 102.

The graph 1300 plots a power level versus the time t. The RF signal 104 has four states, S1, S2, S3, and S4. The RF signal 104 transitions from the state S1 to the state S2 further to the state S3 and to the state S4. The power level P2 of the state S2 is lower than a power level P1 of the state S1. The power level P1 of the state S1 is lower than a power level P3 of the state S3, and the power level P3 is lower than the power level P4 of the state S4. For example, the power level P2 is an envelope of the RF signal during the state S2, the power level P1 is an envelope of the RF signal during the state S1, the power level P3 is an envelope of the RF signal during the state S3, and the power level P4 is an envelope of the RF signal during the state S4.

In various embodiments, a frequency level of the state S4 is greater than or lower than a frequency level of the state S3. Similarly, a frequency level of the state S2 is greater than or lower than a frequency level of the state S3.

In various embodiments, the power level of the state S1 is lower than the power level of the state S2. In several embodiments, the power level of the state S4 is lower than the power level of the state S3 and a frequency level of the state S4 is greater than or lower than a frequency level of the state S3. In some embodiments, the power level of the state S2 is greater than the power level of the state S3 and a frequency level of the state S2 is greater than or lower than a frequency level of the state S3.

In several embodiments, a power level of a first state, e.g., S1, S2, S3, S4, etc., is greater than or less than a power level of a second state, e.g., S1, S2, S3, S4, etc. Moreover, a frequency level of the first state is greater than or less than a frequency level of the second state.

It should be noted that in some embodiments, the above-described embodiments described with respect to FIGS. 1 through 11 are applicable to the RF signal having more than two states. For example, when an RF signal having the three states S1, S2, and S3 is generated by the RF generator 104, another load impedance ZL1(S3) at the output of the model system 102 is determined for the state S3 in the same manner in which the load impedance ZL1(S1) is determined using FIG. 1. Moreover, an RF value RFoptimum1(S3)@C1 for the state S3 is determined in the same manner in which the RF value RFoptimum1(S1)@C1 is determined using the FIG. 2 except that to determine the Coptimum1, a combination of the voltage reflection coefficient Γ(S1), the voltage reflection coefficient Γ(S2), and a voltage reflection coefficient Γ(S3) for the state S3 is minimized, and to determine the RF value RFoptimum1(S3)@C1, the voltage reflection coefficient Γ(S3) is minimized. Also, yet another load impedance ZL2(S3) at the output 144 of the model system 102 is determined for the state S3 in the same manner in which the load impedance ZL2(S1) is determined using FIG. 5. Moreover, an RF value RFoptimum1(S3)@Cstep1 for the state S3 is determined in the same manner in which the RF value RFoptimum1(S1)@Cstep1 is determined using the FIG. 6 except that the voltage reflection coefficient Γ(S3) is minimized During the state S3 of the RF signal generated by the RF generator, the RF value RFoptimum1(S3)@Cstep1 is applied to the RF generator 104 and the combined variable capacitance Cstep2 is applied to the impedance matching network 106.

In various embodiments, N states, e.g., 8 states, 16 states, etc., of an RF signal generated by the RF generator 104 are used, where N is an integer greater than or equal to two. In various embodiments, a clock cycle of the clock signal during which the N states occur is the same as one during which (N−1) states occur. For example, two state of an RF signal occur within the same time period of the clock cycle of the clock signal in which three states of the RF signal occur.

It should be noted that in some of the above-described embodiments, an RF signal is supplied to the lower electrode of the chuck 118 and the upper electrode 116 is grounded. In various embodiments, an RF signal is applied to the upper electrode 116 and the lower electrode of the chuck 118 is grounded.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, DSPs, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, the x MHz RF generator, the y MHz RF generator, and the z MHz RF generator are coupled to an inductor within the ICP plasma chamber. Examples of a shape of the inductor include a solenoid, a dome-shaped coil, a flat-shaped coil, etc.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for controlling a radio frequency (RF) generator, comprising:
   receiving during a first state of the RF generator a first measured input parameter value of a parameter sensed between an output of the RF generator and an input of an impedance matching network when the RF generator operates at a first parametric value and the impedance matching network has a first variable measurable factor;
   initializing for the first state one or more models to have the first variable measurable factor and the first parametric value, wherein the one or more models include a model of the impedance matching network;
   calculating for the first state a first output parameter value using the one or more models from the first measured input parameter value after the one or more models are initialized to have the first variable measurable factor and the first parametric value;
   calculating, using the first output parameter value and the one or more models, a first operating parametric value for which a variable for the first state at an input of the one or more models is at a minimum; and
   controlling during the first state the RF generator to operate at the first operating parametric value.

2. The method of claim 1, further comprising:
   receiving during a second state of the RF generator a second measured input parameter value sensed between the output of the RF generator and the input of the impedance matching network when the RF generator operates at a second parametric value and the impedance matching network has the first variable measurable factor;
   initializing for the second state the one or more models to have the first variable measurable factor and the second parametric value;
   calculating for the second state a second output parameter value using the one or more models from the second measured input parameter value when the one or more models have the first variable measurable factor and the second parametric value;
   calculating, using the second output parameter value and the one or more models, a second operating parametric value for which the variable for the second state at the input of the one or more models is at a minimum; and
   controlling during the second state the RF generator to operate at the second operating parametric value.

3. The method of claim 2, further comprising:
   receiving during the first state of the RF generator a third measured input parameter value sensed between the output of the RF generator and the input of the impedance matching network when the RF generator operates at the first operating parametric value;
   initializing for the first state the one or more models to have the first favorable operating parametric value;
   calculating for the first state a third output parameter value using the one or more models from the third measured input parameter value when the one or more models have the first operating parametric value;
   calculating, using the third output parameter value and the one or more models, a third operating parametric value for which the variable for the first state at the input of the one or more models is at a minimum; and
   controlling during the first state the RF generator to operate at the third operating parametric value.

4. The method of claim 3, further comprising:
   receiving during the second state of the RF generator a fourth measured input parameter value sensed between the output of the RF generator and the input of the impedance matching network when the RF generator operates at the second operating parametric value;
   initializing for the second state the one or more models to have the second operating parametric value;
   calculating for the second state a fourth output parameter value using the one or more models from the fourth measured input parameter value when the one or more models have the second operating parametric value;
   calculating, using the fourth output parameter value and the one or more models, a fourth operating parametric value for which the variable for the second state at the input of the one or more models is at a minimum; and
   controlling during the second state the RF generator to operate at the fourth operating parametric value.

5. The method of claim 2, wherein during the first state, a power level of the RF generator is higher than a power level of the RF generator during the second state.

6. The method of claim 1, wherein the one or more models are computer-generated models, wherein the computer-generated models include a model of an RF transmission line and a model of an RF cable.

7. The method of claim 1, wherein calculating for the first state the first output parameter value using the one or more models from the first measured input parameter value comprises forward propagating the first measured input parameter value via circuit elements of the one or more models to generate the first output parameter value,
  wherein calculating, using the first output parameter value and the one or more models, the first operating parametric value includes solving for the first operating parametric value given the first output parameter value and the one or more models for which the variable for the first state at the input of the one or more models is at the minimum.

8. The method of claim 1, wherein the parameter is an impedance and the variable is a reflection coefficient.

9. A system for tuning a radio frequency (RF) generator, comprising:
  a processor configured to receive during a first state of the RF generator a first measured input parameter value of a parameter sensed between an output of the RF generator and an input of an impedance matching network when the RF generator operates at a first parametric value and the impedance matching network has a first variable measurable factor,
  wherein the processor is configured to initialize for the first state one or more models to have the first variable measurable factor and the first parametric value, where the one or more models include a model of the impedance matching network; and
  a memory device coupled to the processor, wherein the memory device is configured to store the one or more models,
  wherein the processor is configured to calculate for the first state a first output parameter value using the one or more models from the first measured input parameter value when the one or more models have the first variable measurable factor and the first parametric value;
  wherein the processor is configured to calculate, using the first output parameter value and the one or more models, a first operating parametric value for which a variable for the first state at an input of the one or more models is at a minimum; and
  wherein the processor is configured to control during the first state the RF generator to operate at the first operating parametric value.

10. The system of claim 9,
  wherein during a second state of the RF generator, the processor is configured to receive a second measured input parameter value sensed between the output of the RF generator and the input of the impedance matching network when the RF generator operates at a second parametric value and the impedance matching network has the first variable measurable factor,
  wherein the processor is configured to initialize for the second state the one or more models to have the first variable measurable factor and the second parametric value,
  wherein the processor is configured to calculate for the second state a second output parameter value using the one or more models from the second measured input parameter value when the one or more models have the first variable measurable factor and the second parametric value,
  wherein the processor is configured to calculate, using the second output parameter value and the one or more models, a second operating parametric value for which the variable for the second state at the input of the one or more models is at a minimum,
  wherein the processor is configured to control during the second state the RF generator to operate at the second operating parametric value.

11. The system of claim 10,
  wherein the processor is configured to receive during the first state of the RF generator a third measured input parameter value sensed between the output of the RF generator and the input of the impedance matching network when the RF generator operates at the first operating parametric value;
  wherein the processor is configured to initialize for the first state the one or more models to have the first operating parametric value;
  wherein the processor is configured to calculate for the first state a third output parameter value using the one or more models from the third measured input parameter value when the one or more models have the first operating parametric value;
  wherein the processor is configured to calculate, using the third output parameter value and the one or more models, a third operating parametric value for which the variable for the first state at the input of the one or more models is at a minimum;
  wherein the processor is configured to control during the first state the RF generator to operate at the third operating parametric value.

12. The system of claim 11,
  wherein the processor is configured to receive during the second state of the RF generator a fourth measured input parameter value sensed between the output of the RF generator and the input of the impedance matching network when the RF generator operates at the second operating parametric value;
  wherein the processor is configured to initialize for the second state the one or more models to have the second operating parametric value;
  wherein the processor is configured to calculate for the second state a fourth output parameter value using the one or more models from the fourth measured input parameter value when the one or more models have the second operating parametric value;
  wherein the processor is configured to calculate, using the fourth output parameter value and the one or more models, a fourth operating parametric value for which the variable for the second state at the input of the one or more models is at a minimum;
  wherein the processor is configured to operate during the second state the RF generator at the fourth operating parametric value.

13. The system of claim 10, wherein during the first state, a power level of the RF generator is higher than a power level of the RF generator during the second state.

14. The system of claim 9, wherein the one or more models are computer-generated models, wherein the computer-generated models include a model of an RF transmission line and a model of an RF cable.

15. The system of claim 9, wherein to calculate for the first state the first output parameter value using the one or more models from the first measured input parameter value, the processor is configured to forward propagate the first measured input parameter value via circuit elements of the one or more models to generate the first output parameter value,
  wherein to calculate, using the first output parameter value and the one or more models, the first operating parametric value, the processor is configured to solve for the first operating parametric value given the first output parameter value and the one or more models for which the variable for the first state at the input of the one or more models is at the minimum.

16. The system of claim 9, wherein the parameter is an impedance and the variable is a reflection coefficient.

17. A system comprising:
a radio frequency (RF) generator having an output;
an impedance matching network having an input connected to the output of the RF generator;
a plasma chamber connected to the impedance matching network via an RF transmission line; and
a processor coupled to the RF generator,
wherein the processor is configured to receive during a first state of the RF generator a first measured input parameter value of a parameter sensed between the output of the RF generator and the input of the impedance matching network when the RF generator operates at a first parametric value and the impedance matching network has a first variable measurable factor,
wherein the processor is configured to initialize for the first state one or more models to have the first variable measurable factor and the first parametric value, wherein the one or more models include a model of the impedance matching network,
wherein the processor is configured to calculate for the first state a first output parameter value using the one or more models from the first measured input parameter value when the one or more models have the first variable measurable factor and the first parametric value;
wherein the processor is configured to calculate, using the first output parameter value and the one or more models, a first operating parametric value for which a variable for the first state at an input of the one or more models is at a minimum;
wherein the processor is configured to control during the first state the RF generator to operate at the first operating parametric value.

18. The system of claim 17,
wherein during a second state of the RF generator, the processor is configured to receive a second measured input parameter value sensed between the output of the RF generator and the input of the impedance matching network when the RF generator operates at a second parametric value and the impedance matching network has the first variable measurable factor,
wherein the processor is configured to initialize for the second state the one or more models to have the first variable measurable factor and the second parametric value,
wherein the processor is configured to calculate for the second state a second output parameter value using the one or more models from the second measured input parameter value when the one or more models have the first variable measurable factor and the second parametric value,
wherein the processor is configured to calculate, using the second output parameter value and the one or more models, a second operating parametric value for which the variable for the second state at the input of the one or more models is at a minimum,
wherein the processor is configured to control during the second state the RF generator to operate at the second operating parametric value.

19. The system of claim 18,
wherein the processor is configured to receive during the first state of the RF generator a third measured input parameter value sensed between the output of the RF generator and the input of the impedance matching network when the RF generator operates at the first operating parametric value;
wherein the processor is configured to initialize for the first state the one or more models to have the first operating parametric value;
wherein the processor is configured to calculate for the first state a third output parameter value using the one or more models from the third measured input parameter value when the one or more models have the first operating parametric value;
wherein the processor is configured to calculate, using the third output parameter value and the one or more models, a third operating parametric value for which the variable for the first state at the input of the one or more models is at a minimum;
wherein the processor is configured to control during the first state the RF generator to operate at the third operating parametric value.

20. The system of claim 19,
wherein the processor is configured to receive during the second state of the RF generator a fourth measured input parameter value sensed between the output of the RF generator and the input of the impedance matching network when the RF generator operates at the second operating parametric value;
wherein the processor is configured to initialize for the second state the one or more models to have the second operating parametric value;
wherein the processor is configured to calculate for the second state a fourth output parameter value using the one or more models from the fourth measured input parameter value when the one or more models have the second operating parametric value;
wherein the processor is configured to calculate, using the fourth output parameter value and the one or more models, a fourth operating parametric value for which the variable for the second state at the input of the one or more models is at a minimum;
wherein the processor is configured to operate during the second state the RF generator at the fourth operating parametric value.

21. The system of claim 18, wherein during the first state, a power level of the RF generator is higher than a power level of the RF generator during the second state.

22. The system of claim 17, wherein the one or more models are computer-generated models, wherein the computer-generated models include a model of the RF transmission line and a model of an RF cable.

23. The system of claim 17, wherein to calculate for the first state the first output parameter value using the one or more models from the first measured input parameter value, the processor is configured to forward propagate the first measured input parameter value via circuit elements of the one or more models to generate the first output parameter value,
wherein to calculate, using the first output parameter value and the one or more models, the first operating parametric value, the processor is configured to solve for the first operating parametric value give the first output parameter value and the one or more models for which the variable for the first state at the input of the one or more models is at the minimum.

24. The system of claim 17, wherein the parameter is an impedance and the variable is a reflection coefficient.

* * * * *